(12) United States Patent
Tsubaki et al.

(10) Patent No.: US 12,392,596 B2
(45) Date of Patent: Aug. 19, 2025

(54) FLATNESS MEASUREMENT UNIT

(71) Applicant: MURATA MACHINERY, LTD., Kyoto (JP)

(72) Inventors: Tatsuo Tsubaki, Ise (JP); Hiroyuki Yokoyama, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 551 days.

(21) Appl. No.: 17/905,728

(22) PCT Filed: Jan. 21, 2021

(86) PCT No.: PCT/JP2021/002098
§ 371 (c)(1),
(2) Date: Sep. 6, 2022

(87) PCT Pub. No.: WO2021/181906
PCT Pub. Date: Sep. 16, 2021

(65) Prior Publication Data
US 2023/0108771 A1 Apr. 6, 2023

(30) Foreign Application Priority Data

Mar. 9, 2020 (JP) ................................. 2020-040170
Nov. 18, 2020 (JP) ................................. 2020-191781

(51) Int. Cl.
*G01B 5/28* (2006.01)
*G01B 5/00* (2006.01)
(Continued)

(52) U.S. Cl.
CPC ............ *G01B 5/28* (2013.01); *G01B 5/0007* (2013.01); *H01L 21/67288* (2013.01); *H01L 21/67769* (2013.01)

(58) Field of Classification Search
CPC .......... G01B 5/0007; G01B 5/28; G01B 5/00; H01L 21/67288; H01L 21/67769
(Continued)

(56) References Cited

U.S. PATENT DOCUMENTS 5,859,783 A * 1/1999 Ytterberg ................. G01C 7/04
33/1 BB
6,567,169 B1 * 5/2003 Schober ................. G01B 21/30
356/399
(Continued)

FOREIGN PATENT DOCUMENTS

CN 221798087 U * 10/2024
JP 05-059207 8/1993
(Continued)

OTHER PUBLICATIONS

Talyvel® 6 and Clinometers. Brochure [online]. Taylor Hobson Ltd., 2018 [retrieved on May 2, 2025]. Retrieved from the Internet: ( Year: 2018) URL: https://www.taylor-hobson.com/-/media/ametektaylorhobson/files/product%20downloads/electronic%20levels%20and%20clinometers/talyvel-6_clinometers_lowres_en.pdf>. (Year: 2018).*

(Continued)

*Primary Examiner* — Peter J Macchiarolo
*Assistant Examiner* — Daniel M Quinn
(74) *Attorney, Agent, or Firm* — Keating & Bennett, LLP

(57) ABSTRACT

A flatness measurement unit is a flatness measurement unit to be placed on a shelf for measuring flatness relating to the degree of deviation from a state in which four predetermined points on the shelf are present on the same plane. The flatness measurement unit includes: a body frame; and four contact sections dispersedly disposed on the body frame and provided so as to be in contact with the respective four predetermined points on the shelf. The four contact sections
(Continued)

include two first contact sections not located diagonally and two second contact sections other than the first contact sections. The center of gravity of the flatness measurement unit is positioned in an area containing the two first contact sections, among four areas defined by two diagonal lines each passing through the corresponding first contact section and the corresponding second contact section that are located diagonally.

14 Claims, 19 Drawing Sheets

(51) Int. Cl.
    *H01L 21/67*     (2006.01)
    *H01L 21/677*     (2006.01)

(58) Field of Classification Search
    USPC .......................................................... 33/533
    See application file for complete search history.

(56) References Cited

U.S. PATENT DOCUMENTS

2015/0012245 A1* 1/2015 Xiao ...................... G01B 21/20
                                                                                        702/168

2015/0025845 A1* 1/2015 Mansfield .............. G01D 5/347
                                                                                        702/168
2016/0130084 A1* 5/2016 Omori ............... H01L 21/67769
                                                                                        700/218

FOREIGN PATENT DOCUMENTS

| JP | H11-108655 | | 4/1999 | |
| --- | --- | --- | --- | --- |
| JP | 2013002819 | A * | 1/2013 | |
| JP | 2016-094265 | | 5/2016 | |
| JP | 2018-129400 | | 8/2018 | |
| WO | WO-9208101 | A1 * | 5/1992 | ............... G01B 7/28 |
| WO | WO 2015/194255 | | 12/2015 | |
| WO | WO 2017/038268 | | 3/2017 | |
| WO | WO-2020021098 | A1 * | 1/2020 | ......... G01B 11/2518 |

OTHER PUBLICATIONS

International Search Report in International Appln. No. PCT/JP2021/002098, dated Apr. 13, 2021, 4 pages (with English Translation).

\* cited by examiner

FLATNESS MEASUREMENT UNIT

CROSS-REFERENCE TO RELATED APPLICATIONS

This application is a National Stage Application under 35 U.S.C. § 371 and claims the benefit of International Application No. PCT/JP2021/002098, filed Jan. 21, 2021, which claims priority to JP Provisional Patent Application Serial No. 2020-040170, filed on Mar. 3, 2020 and to JP Provisional Patent Application Serial No. 2020-191781, filed on Nov. 18, 2020, the entire contents of each of which are incorporated herein by reference.

TECHNICAL FIELD

An aspect of the present invention relates to a flatness measurement unit.

BACKGROUND ART

A purge stocker including a plurality of shelves, on which storage containers are placed, and configured to purge the inside of the storage containers placed on the shelves with purge gas is known (see Patent Literature 1, for example). In such a purge stocker, a plurality of nozzles configured to circulate purge gas to and from a storage container are provided on each shelf.

CITATION LIST

Patent Literature

[Patent Literature 1] International Publication No. WO2015-194255

SUMMARY OF INVENTION

Technical Problem

In the above-described purge stocker, when a storage container is placed on a shelf, in order to properly perform the purging, the corresponding nozzles need to be brought into close contact with the storage container at a predetermined contact pressure. This requires that certain four points on the shelf be present on the same plane in order to properly place the storage container on the shelf. Thus, in the above-described purge stocker, it is desirable to measure flatness relating to the degree of deviation from a state in which the four predetermined points on the shelf are present on the same plane. As such a method for measuring the flatness on the shelf, a method of performing three-dimensional measurement at the four predetermined points can be conceived, but it is unrealistic due to the large amount of time and labor involved in the measuring operation.

An aspect of the present invention has been made in view of the above-described circumstances, and it is an object to provide a flatness measurement unit that can easily perform operation of measuring the flatness on a shelf.

Solution to Problem

A flatness measurement unit according to an aspect of the present invention is a flatness measurement unit to be placed on a shelf for measuring flatness relating to degree of deviation from a state in which four predetermined points on the shelf are present on the same plane. The flatness measurement unit includes: a body frame; and four contact sections dispersedly disposed on the body frame in four directions and provided so as to be in contact with the respective four predetermined points on the shelf. The four contact sections include two first contact sections not located diagonally and two second contact sections other than the first contact sections. The center of gravity of the flatness measurement unit is positioned in an area containing the two first contact sections, among four areas defined by two diagonal lines each passing through the corresponding first contact section and the corresponding second contact section that are located diagonally.

The flatness measurement unit is placed on the shelf such that the contact sections are arranged on the four predetermined points on the shelf. In this case, because a perfect plane is defined by three points, when the four predetermined points are not present on the same plane, a gap is formed between any one of these points and the corresponding contact section, and thus the value of this gap can be measured as the flatness. The center of gravity of the flatness measurement unit is positioned in the area containing the two first contact sections among the four areas defined by the two diagonal lines each passing through the corresponding first contact section and the corresponding second contact section that are located diagonally (the weight on a side closer to the first contact sections is heavier than the weight on a side closer to the second contact sections), and thus in the measurement, the two first contact sections are always in contact with the corresponding predetermined points on the shelf. Thus, without the need to measure the gap between every contact section and the corresponding predetermined point, only the gap between each second contact section and the corresponding predetermined point should be measured, and thus time and labor in measuring operation can be saved. Consequently, operation of measuring the flatness on the shelf can be easily performed.

The flatness measurement unit according to an aspect of the present invention may include a measuring device provided near the second contact sections on the body frame and configured to measure a distance to a predetermined point corresponding to each second contact section on the shelf when the flatness measurement unit is placed on the shelf or a distance to a point near the predetermined point. In this configuration, operation of measuring the flatness on the shelf can be performed more easily with reduced manpower.

In the flatness measurement unit according to an aspect of the present invention, each second contact section may have a protrusion forming a spherical or convexly curved contact surface. The minimum gap between each second contact section and the corresponding predetermined point on the shelf can be easily measured, even from a plurality of directions.

In the flatness measurement unit according to an aspect of the present invention, each first contact section may have a groove or recess having an inner surface as a contact surface. In this configuration, the first contact section can be reliably brought into contact with even a portion protruding upward on the shelf.

In the flatness measurement unit according to an aspect of the present invention, each contact section may have a hardness lower than that of the body frame. In this configuration, damage to a predetermined point on the shelf with which the contact section has come into contact can be prevented.

In the flatness measurement unit according to an aspect of the present invention, the body frame may be provided with a handle for an operator to grasp. In this configuration, the flatness measurement unit can be easily handled by hand, making it possible to more easily perform operation of measuring the flatness on the shelf.

In the flatness measurement unit according to an aspect of the present invention, a balance weight may be provided on a side of the body frame closer to the first contact sections. In this case, it is possible to reliably achieve a configuration in which the weight on the side closer to the first contact sections in the flatness measurement unit is heavier than the weight on the side closer to the second contact sections.

In the flatness measurement unit according to an aspect of the present invention, a pin protruding upward may be provided on the shelf, and in the body frame, a groove or recess that forms a gap between the pin and the flatness measurement unit when the flatness measurement unit is placed on the shelf may be formed. In this configuration, when the flatness measurement unit is placed on the shelf, contact with the pin on the shelf can be avoided by using the groove or recess.

In the flatness measurement unit according to an aspect of the present invention, a nozzle protruding upward may be provided on the shelf, and the body frame may have an opening through which the nozzle passes when the flatness measurement unit is placed on the shelf. In this configuration, when the flatness measurement unit is placed on the shelf, contact with the nozzle on the shelf can be avoided by using the opening.

The flatness measurement unit according to an aspect of the present invention is a flatness measurement unit to be placed on a shelf for measuring flatness relating to degree of deviation from a state in which four predetermined points on the shelf are present on the same plane. The flatness measurement unit includes: a body frame; and three contact sections dispersedly disposed on the body frame and provided so as to be in contact with the corresponding three predetermined points out of the four predetermined points on the shelf. The center of gravity of the flatness measurement unit is positioned inside a triangular area having vertices at the respective three contact sections.

When this flatness measurement unit is placed on the shelf, the three contact sections are always in contact with the corresponding predetermined points on the shelf because the center of gravity of the flatness measurement unit is positioned inside the triangular area having vertices at the respective three contact sections. In this case, because a perfect plane is defined by three points, when the four predetermined points are present on the same plane, a gap of a specified amount is formed between one point, with which the contact sections are not in contact, out of the four predetermined points and the flatness measurement unit. Thus, the value of this gap can be measured as the flatness, and time and labor in operation of measuring the flatness on the shelf can be saved. Thus, the operation of measuring the flatness on the shelf can be easily performed.

The flatness measurement unit according to an aspect of the present invention may include a measurement protrusion disposed on the body frame and provided at a position corresponding to the remaining predetermined point out of the four predetermined points on the shelf other than the three predetermined points in contact with the respective three contact sections. The measurement protrusion may be configured such that a gap is formed between the measurement protrusion and the remaining predetermined point when the flatness measurement unit is placed on the shelf. This configuration allows the flatness to be measured based on the gap between the measurement protrusion and the remaining predetermined point.

In the flatness measurement unit according to an aspect of the present invention, each contact section may have a protrusion forming a contact surface, and a height of each measurement protrusion may be lower than that of a plane defined by apexes of the respective protrusions of the three contact sections. This configuration makes it possible to reliably achieve a configuration in which a gap is formed between the measurement protrusion and the remaining predetermined point when the flatness measurement unit is placed on the shelf.

In the flatness measurement unit according to an aspect of the present invention, a distance between the apex of the measurement protrusion and the plane defined by the apexes of the respective protrusions of the three contact sections may be equal to or greater than a maximum deviation amount. This configuration makes it possible to more reliably achieve a configuration in which a gap is formed between the measurement protrusion and the remaining predetermined point when the flatness measurement unit is placed on the shelf.

The flatness measurement unit according to an aspect of the present invention may include a measuring device provided to the body frame and configured to, when the flatness measurement unit is placed on the shelf, measure a distance to the remaining predetermined point out of the four predetermined points on the shelf other than the three predetermined points in contact with the respective three contact sections or a distance to a point near the remaining predetermined point. In this configuration, operation of measuring the flatness on the shelf can be performed more easily with reduced manpower.

Advantageous Effects of Invention

According to an aspect of the present invention, the flatness measurement unit that can easily perform operation of measuring the flatness on the shelf can be provided.

DESCRIPTION OF EMBODIMENTS

Figure 1:
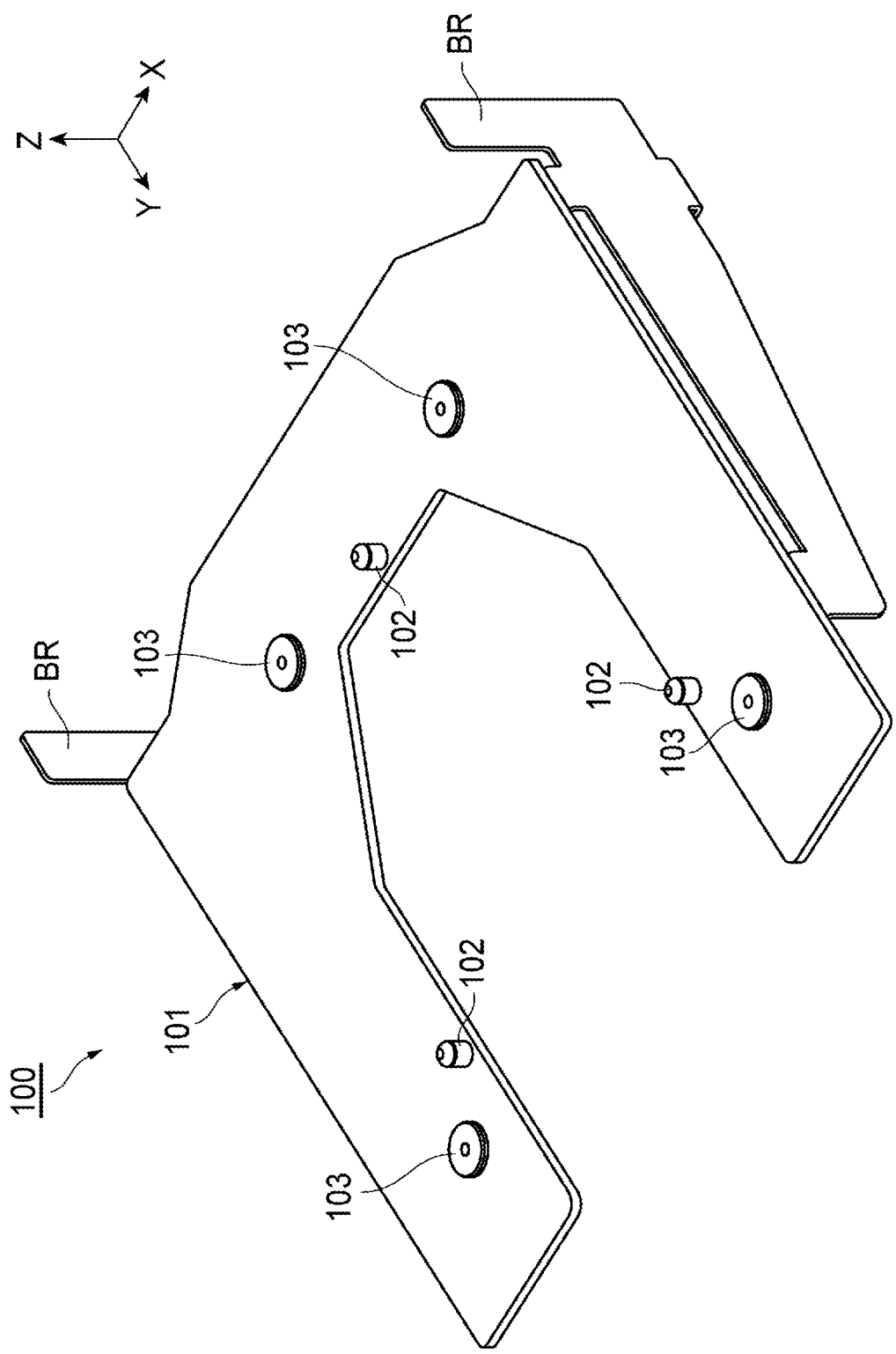
FIG. 1 is a perspective view illustrating a shelf on which a flatness measurement unit according to a first embodiment is to be placed.

One embodiment will now be described with reference to the drawings. In description of the drawings, like elements are designated by like reference signs, and duplicate description is omitted. The dimensional proportions in the drawings do not necessarily match those in the description. The terms "up" and "down" are terms for convenience based on states illustrated in the drawings.

First Embodiment

Figure 2:
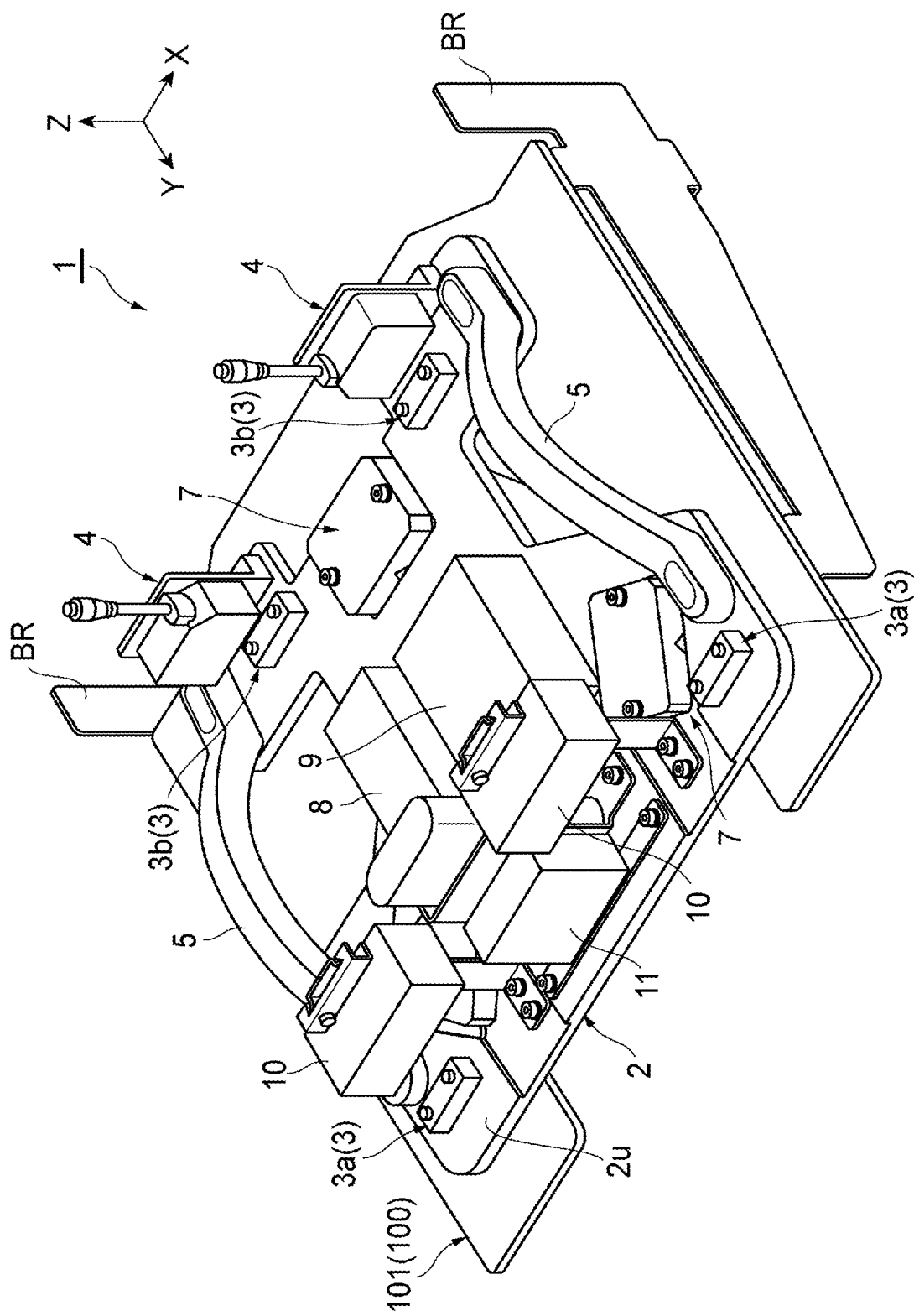
FIG. 2 is a perspective view illustrating a state in which the flatness measurement unit according to the first embodiment is placed on the shelf.
Figure 3:
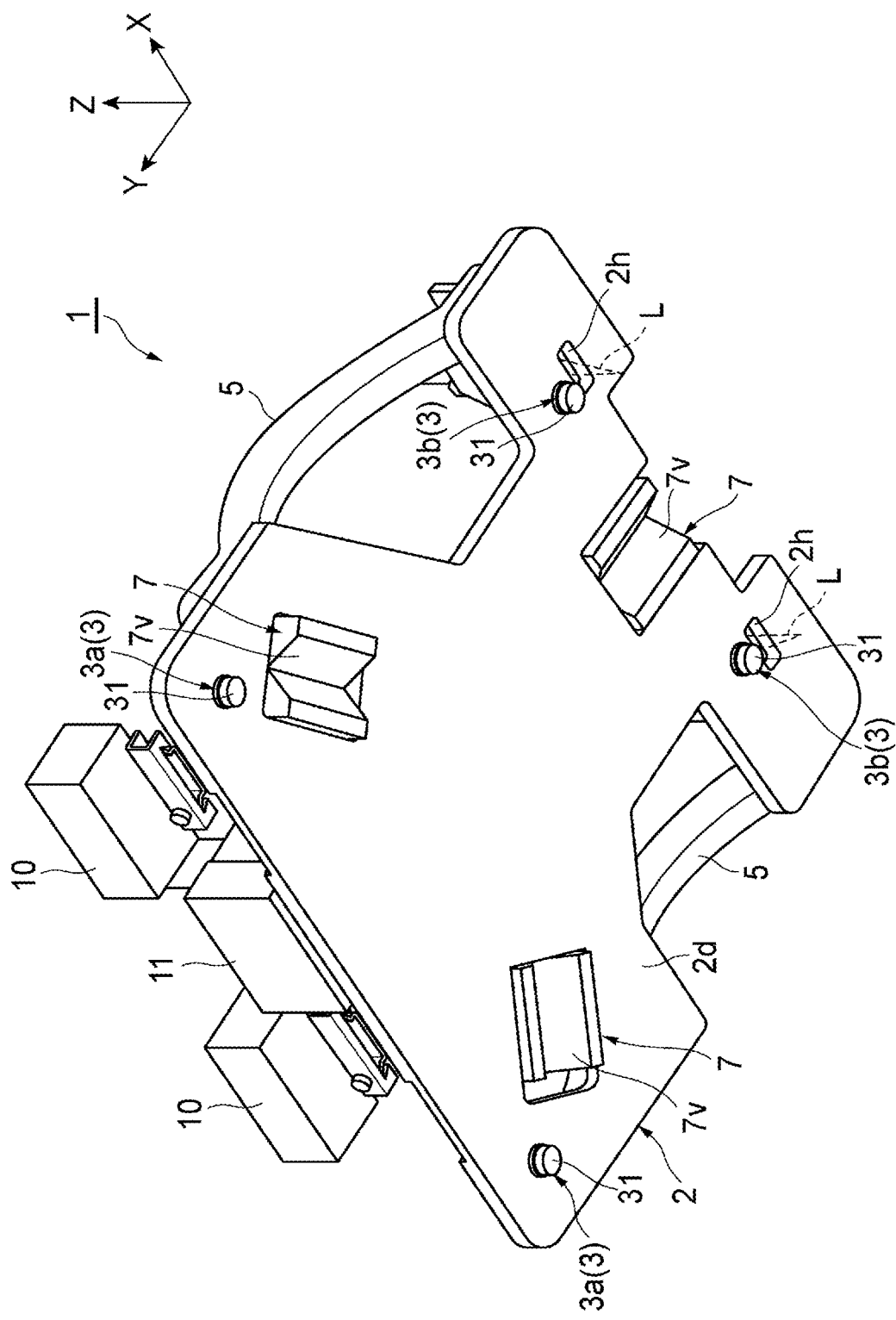
FIG. 3 is a perspective view of the flatness measurement unit according to the first embodiment when viewed from below.
Figure 4:
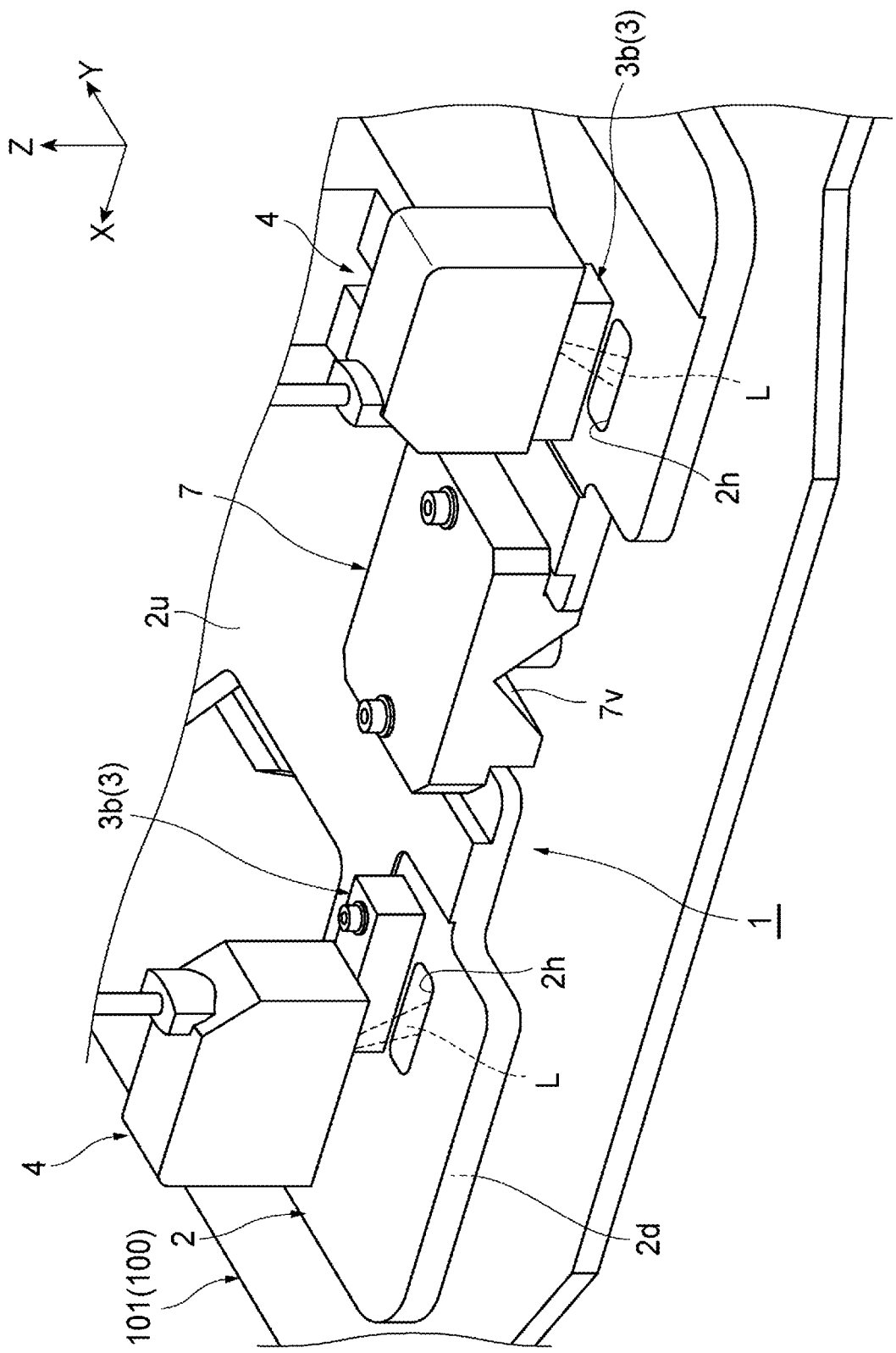
FIG. 4 is a perspective view illustrating a rear side of the flatness measurement unit according to the first embodiment.

FIG. 1 is a perspective view illustrating a shelf 101 on which a flatness measurement unit 1 is to be placed. FIG. 2 is a perspective view illustrating the flatness measurement unit 1 placed on the shelf 101. FIG. 3 is a perspective view of the flatness measurement unit 1 when viewed from below. FIG. 4 is a perspective view illustrating a rear side of the flatness measurement unit 1. The X-direction corresponds to one horizontal direction, the Y-direction corresponds to a horizontal direction orthogonal to the X-direction, and the Z-direction corresponds to the vertical direction.

As illustrated in FIG. 1 and FIG. 2, the flatness measurement unit 1 is a unit to be placed on the shelf 101 for measuring the flatness on the shelf 101. The flatness on the shelf 101 is an index relating to the degree of deviation from a state in which four predetermined points on the shelf 101 are present on the same plane. The flatness on the shelf 101 can be expressed, for example, by the size of a gap (gap amount) formed between a plane defined by any three out of the four predetermined points on the shelf 101 and the remaining one predetermined point. The larger the gap amount is, the worse the flatness is determined to be. The flatness on the shelf 101 is not limited to a particular one as long as it relates to the degree of the deviation, and various known indices may be used.

The shelf 101 constitutes a purge shelf of a purge stocker 100. The purge stocker 100 purges the inside of a storage container with purge gas and also serves as a stocker configured to store a plurality of the storage containers. Each storage container is a reticle pod or a front opening unified pod (FOUP), for example, in which objects to be stored such as semiconductor wafers or glass substrates are stored. As the purge gas, for example, nitrogen gas or air is used. The purge stocker 100 is provided in a clean room, for example.

A plurality of the shelves 101 are disposed so as to be aligned along the X-direction and the Z-direction in the purge stocker 100. Each shelf 101 is supported by shelf brackets BR. The shelf 101 is formed in a plate-like shape along the XY plane. The shelf 101 has an opening on the front side (one side in the Y-direction) when viewed from above. On the shelf 101, a storage container is to be placed. On the shelf 101, three pins 102 protruding upward are provided. The pins 102 are kinematic pins and have a function of positioning the storage container. In the illustrated example, the pins 102 are dispersedly disposed at three points that are not present in a straight line on the upper surface of the shelf 101 when viewed from above.

On the shelf 101, four nozzles 103 protruding upward are provided. The nozzles 103 circulate purge gas to and from the storage container placed on the shelf 101. The top of each nozzle 103, which is the tube end thereof, is formed with a rigid body. The upper surface of the nozzle 103 is formed flat. When the upper surface of the nozzle 103 is closely attached to a ventilation port of the storage container, purge gas can be supplied into the storage container, or excess purge gas can be discharged from the inside of the storage container. The nozzles 103 are dispersedly disposed in four directions on the upper surface of the shelf 101. In the illustrated example, the nozzles 103 are dispersedly disposed at four corners of the shelf 101 (two on the front side and two on the rear side (the other side in the Y-direction)) when viewed from above. In the present embodiment, the storage container is supported on the shelf 101 in a manner placed on the upper surfaces of the four nozzles 103. The respective upper surfaces of the four nozzles 103 correspond to four predetermined points the flatness at which is to be measured by the flatness measurement unit 1.

As illustrated in FIG. 2, FIG. 3, and FIG. 4, the flatness measurement unit 1 includes a body frame 2, contact sections 3, measuring devices 4, handles 5, guide members 7, a battery 8, a data logger 9, indicators 10, and a transformer 11.

The body frame 2 has a plate-like shape with a size capable of being placed on the shelf 101. The body frame 2 has an upper surface $2u$ and a lower surface $2d$ that are flat. The body frame 2 is formed of metal such as aluminum. In the illustrated example, the body frame 2 has such a shape that, when viewed from above, one side and the other side thereof in the Y-direction are wider in the X-direction than the central part thereof in the Y-direction (in other words, the central part in the Y-direction is narrower (more constricted)).

Each contact section 3 is formed separately from the body frame 2. The contact section 3 has a hardness lower than that of the body frame 2. The contact section 3 is formed of resin. The contact section 3 here is formed by poly ether ether ketone (PEEK) resin that has excellent abrasion resistance. The four contact sections 3 are dispersedly disposed in four directions on the body frame 2. The contact sections 3 are provided so as to be in contact with the respective four nozzles 103 of the shelf 101. The contact sections 3 are provided at positions in the body frame 2 corresponding to the four nozzles 103.

The four contact sections 3 include two first contact sections 3a and two second contact sections 3b. The first contact sections 3a are disposed at two front points in the body frame 2. The second contact sections 3b are disposed at two rear points in the body frame 2. The two first contact sections 3a are contact sections 3 that are not located diagonally among the four contact sections 3. The two second contact sections 3b are contact sections 3 that are other than the first contact sections 3a among the four contact sections 3 and are not located diagonally. The line segment connecting the two first contact sections 3a and the line segment connecting the two second contact sections 3b do not intersect.

Each contact section 3 is fastened with screws, for example, on the upper surface 2u side of the body frame 2. The contact section 3 has a protrusion 31 forming a spherical contact surface. The protrusion 31 is a portion of the contact section 3 that penetrates downward through the body frame 2 and protrudes from the lower surface 2d when the contact section 3 is attached to the body frame 2. The protrusion 31 has a cylindrical shape and its lower end surface is the contact surface. The contact surface is a surface that can be in contact with a predetermined point on the shelf 101. The positions of the apexes (lower end points) of the protrusions 31 of the four contact sections 3 are present on the same plane.

The measuring devices 4 are provided near the respective second contact sections 3b on the body frame 2. The measuring devices 4 measure the distances to the upper surfaces of the rear nozzles 103 (the nozzles 103 corresponding to the second contact sections 3b). Each measuring device 4 here is provided at a position close to the rear side of the corresponding second contact section 3b. When viewed from above, the area containing the protrusion 31 of the second contact section 3b and the measuring point of the measuring device 4 is set to fit within the upper surface of the corresponding nozzle 103.

As the measuring device 4, for example, a laser length measuring machine is used. The measuring device 4 emits measurement light L downward, and measures the distance to the upper surface of the nozzle 103 by emitting the measurement light L downward and receiving its reflected light reflected from the upper surface of the nozzle 103 through a measurement through-hole 2h formed in the body frame 2. The measuring device 4 is not limited to a particular one, and various known devices can be used. As the measuring device 4, for example, a dial gauge may be used.

The handles 5 are portions to be gripped by the operator. The handles 5 are fixed to both ends of the upper surface 2u of the body frame 2 in the X-direction. As the handles 5, long members formed to be appropriately bent are used.

Each guide member 7 is a block-shaped member having a V-groove (groove) 7v that is open downward and extends in the horizontal direction. The V-groove 7v is a groove having a V-shaped cross section. The three guide members 7 are provided in the body frame 2 such that the V-grooves 7v are exposed downward. The guide members 7 are fastened with screws, for example, on the upper surface 2u side of the body frame 2. The guide members 7 are dispersedly disposed on the body frame 2. The guide members 7 are provided at positions corresponding to the respective three pins 102. When the flatness measurement unit 1 is placed on the shelf 101, each guide member 7 accommodates the corresponding pin 102 in the V-groove 7v, and also forms a gap between the pin 102 and the V-groove 7v (i.e., prevents the flatness measurement unit 1 from being placed on the pin 102).

The battery 8 is a device configured to supply power to be used in the flatness measurement unit 1. It is fixed near the front center on the upper surface 2u of the body frame 2. The data logger 9 is a device configured to store measurement results measured by the measuring devices 4. The data logger 9 is fixed near the front center on the upper surface 2u of the body frame 2. The indicators 10 are devices configured to indicate the measurement results measured by the measuring devices 4 or stored in the data logger 9. The indicators 10 are provided according to the number of the measuring devices 4, and herein two are provided. The indicators 10 are fixed on one side and the other side in the X-direction on the front side on the upper surface 2u of the body frame 2. One of the indicators 10 indicates measurement results of one of the measuring devices 4, and the other of the indicators 10 indicates measurement results of the other of the measuring devices 4. The transformer 11 is a device configured to appropriately transform the power supplied from the battery 8. The transformer 11 is fixed on the front side on the upper surface 2u of the body frame 2. The battery 8, the data logger 9, the indicators 10, and the transformer 11 are not limited to particular ones, and various known devices can be used.

Figure 5:
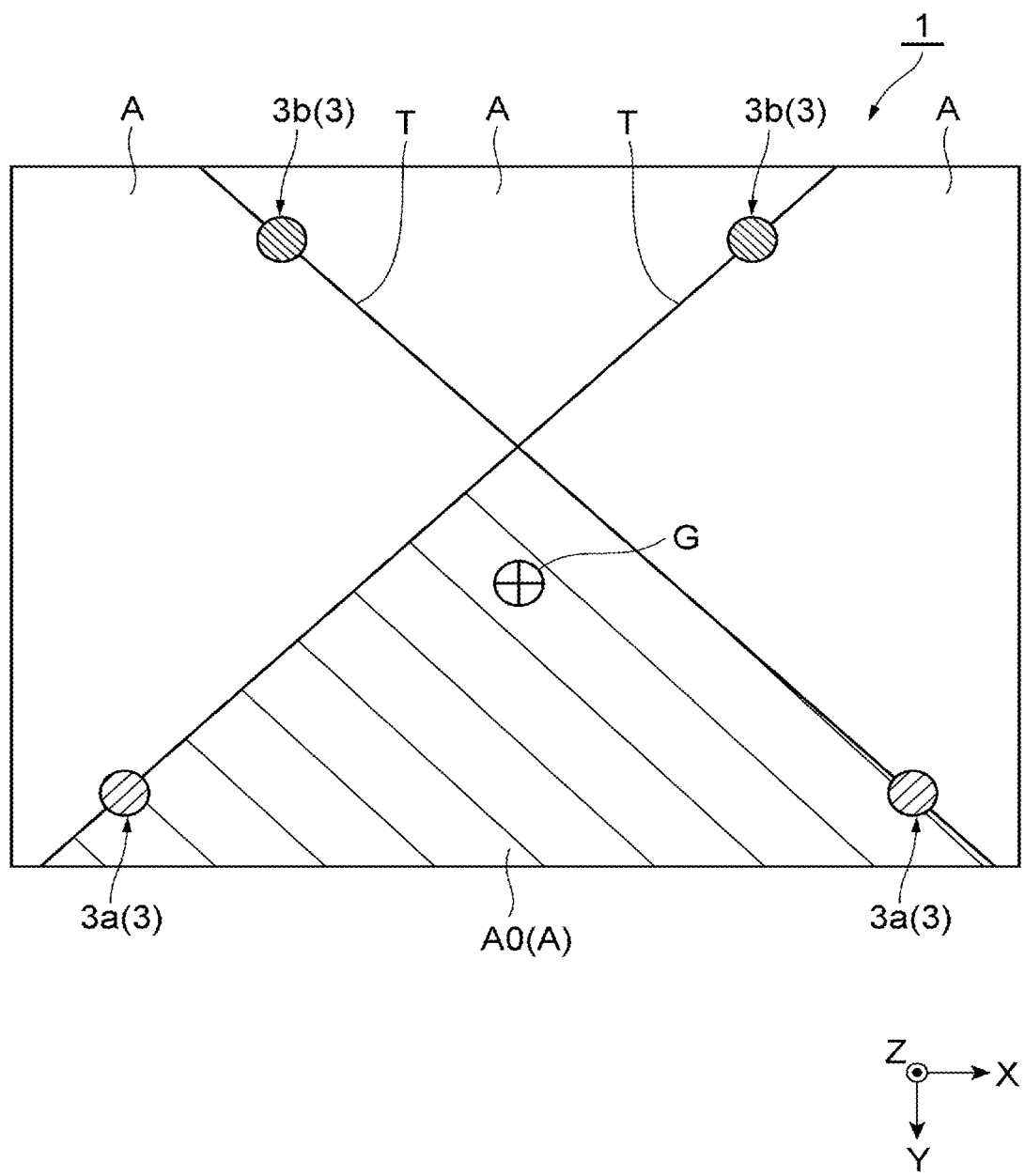
FIG. 5 is a plan view schematically illustrating the flatness measurement unit according to the first embodiment.

In the present embodiment, the weight on the side closer to the first contact sections 3a in the flatness measurement unit 1 is heavier than the weight on the side closer to the second contact sections 3b. In other words, the front side of the flatness measurement unit 1 is heavier than the rear side. As illustrated in FIG. 5, the center of gravity G of the flatness measurement unit 1 is positioned in an area A0, where the two first contact sections 3a are present among four areas A defined by two diagonal lines T each passing through the corresponding first contact section 3a and the corresponding second contact section 3b that are located diagonally. In other words, the second contact sections 3b that are two contact sections 3 on the opposite side of the area A0, where the center of gravity G is positioned among the four areas A defined by the two diagonal lines T each connecting the corresponding diagonally located ones of the four contact sections 3, are used as measurement points where the gaps to the nozzles 103 are to be measured. The first contact sections 3a are the contact sections 3 that define the area A0. The flatness measurement unit 1 is configured such that the center of gravity G is shifted forward (toward the first contact sections 3a) from the center in the Y-direction when viewed from above. As can be seen in the figure, in plan view (top view when the flatness measurement unit 1 is placed on the shelf 101), the center of gravity G is positioned in the area A0 containing the two first contact sections 3a among the four areas A in the flatness measurement unit 1.

The following describes an example of using the flatness measurement unit 1 to measure the flatness on the shelf 101 of the purge stocker 100.

On the shelf 101, because the ventilation ports (purge port surfaces) of the storage container to be placed need to be brought into close contact with the four nozzles 103, the flatness at the upper surfaces of the four nozzles 103 is measured. To begin with, the operator places the flatness measurement unit 1 on a plate and zero-resets the measuring devices 4 with all four contact sections 3 being in contact with the plate. The operator grips the handles 5 and places the flatness measurement unit 1 on a loading-and-unloading port (not illustrated) of the purge stocker 100. The operator starts measurement of the measuring devices 4 and starts recording measurement results in the data logger 9. Thereafter, the measurement results of the measuring devices 4 continue to be recorded by the data logger 9 until the recording is stopped in the data logger 9.

Subsequently, the operator sets a source and a destination of transfer by a crane robot (not illustrated) in the purge stocker 100, and starts the transfer of the flatness measurement unit 1 by the crane robot. Thus, the flatness measurement unit 1 is transferred from the loading-and-unloading port onto the shelf 101 such that the contact sections 3 are in contact with the upper surfaces of the four nozzles 103.

Herein, the weight on the side closer to the first contact sections 3a in the flatness measurement unit 1 is heavier than the weight on the side closer to the second contact sections 3b. Thus, when the flatness measurement unit 1 is placed on the shelf 101, there is no possibility that a gap is formed between each of the two first contact sections 3a and the upper surface of the corresponding nozzle 103, but a gap may be formed between any of the two second contact sections 3b and the upper surface of the corresponding nozzle 103. The gap amount between the second contact section 3b and the upper surface of the nozzle 103 is measured as the flatness by the measuring device 4. When both of the second contact sections 3b are in contact with the upper surfaces of the corresponding nozzles 103, the flatness (gap amount) measured by the measuring device 4 is zero. After a certain period of time when measurement results of the measuring device 4 stabilize, the flatness measurement unit 1 is transferred to the next shelf 101 by the crane robot.

Subsequently, the measurement and transfer described above are repeated for the number of a plurality of the shelves 101. When the measurement of the flatness has been completed for all shelves 101, the flatness measurement unit 1 is returned onto the loading-and-unloading port by the crane robot. The operator stops recording of the data logger 9 and retrieves the recorded data from the data logger 9. Because the recorded data is continuous data from the time of the placement on the loading-and-unloading port to the time of the return, the data is checked against settings of the transfer source and the transfer destination, whereby which part of the data is associated with the flatness of which one of the shelves 101. By the processes described above, the measurement of the flatness for each of the shelves 101 of the purge stocker 100 is completed. Thereafter, if necessary, for example, each shelf 101 is adjusted based on the measured flatness.

As described above, the flatness measurement unit 1 is placed on the shelf 101 such that the contact sections 3 are arranged on the upper surfaces of the four nozzles 103 on the shelf 101. In this case, because a perfect plane is defined by three points, when the upper surfaces of the four nozzles 103 are not present on the same plane, a gap is formed between any one of these points and the corresponding contact section 3, and thus the value of this gap can be measured as the flatness. The center of gravity in the flatness measurement unit 1 is positioned in the area A0 containing the two first contact sections 3a among the four areas A defined by the two diagonal lines T each passing through the corresponding first contact section 3a and the corresponding second contact section 3b that are located diagonally (the weight on the side closer to the first contact sections 3a is heavier than the weight on the side closer to the second contact sections 3b), and thus in the measurement, the two first contact sections 3a are always in contact with the corresponding predetermined points on the shelf 101. Thus, without the need to measure the gap between every contact section 3 and the corresponding nozzle 103, only the gap between each second contact section 3b and the corresponding nozzle 103 need be measured, and thus time and labor in measuring operation can be saved. Consequently, operation of measuring the flatness on the shelf 101 can be easily performed.

In the flatness measurement unit 1, the measuring devices 4 are provided near the second contact sections 3b on the body frame 2. The measuring devices 4 measure the distances to the upper surfaces of the nozzles 103 corresponding to the second contact sections 3b. In this configuration, operation of measuring the flatness on the shelf 101 can be performed more easily with reduced manpower.

In the flatness measurement unit 1, each contact section 3 has a hardness lower than that of the body frame 2. In this configuration, damage to the upper surface of each nozzle 103 with which the corresponding contact section 3 is in contact on the shelf 101 can be prevented.

In the flatness measurement unit 1, the body frame 2 is provided with the handles 5 for the operator to grasp. In this configuration, the flatness measurement unit 1 can be easily handled by hand, making it possible to more easily perform operation of measuring the flatness on the shelf 101.

In the flatness measurement unit 1, the V-grooves 7v are formed in the body frame 2, each of which forms a gap between the flatness measurement unit 1 and the corresponding pin 102 on the shelf 101 when the flatness measurement unit 1 is placed on the shelf 101. In this configuration, when the flatness measurement unit 1 is placed on the shelf 101, contact with the pins 102 can be avoided by using the V-grooves 7v.

The flatness measurement unit 1 is provided with the battery 8, the data logger 9, the indicators 10, and the transformer 11 on the side of the body frame 2 closer to the first contact sections 3a (on the front side). By this configuration, a configuration in which the front side in the flatness measurement unit 1 is heavier than the rear side can be reliably achieved by using the weight of the battery 8, the data logger 9, the indicators 10, and the transformer 11. The flatness measurement unit 1 is at least provided with the measuring devices 4, the battery 8, and the data logger 9, thereby enabling automatic measurement of the flatness.

Second Embodiment

The following describes a second embodiment. In description of the present embodiment, points different from the first embodiment above will be described.

Figure 6:
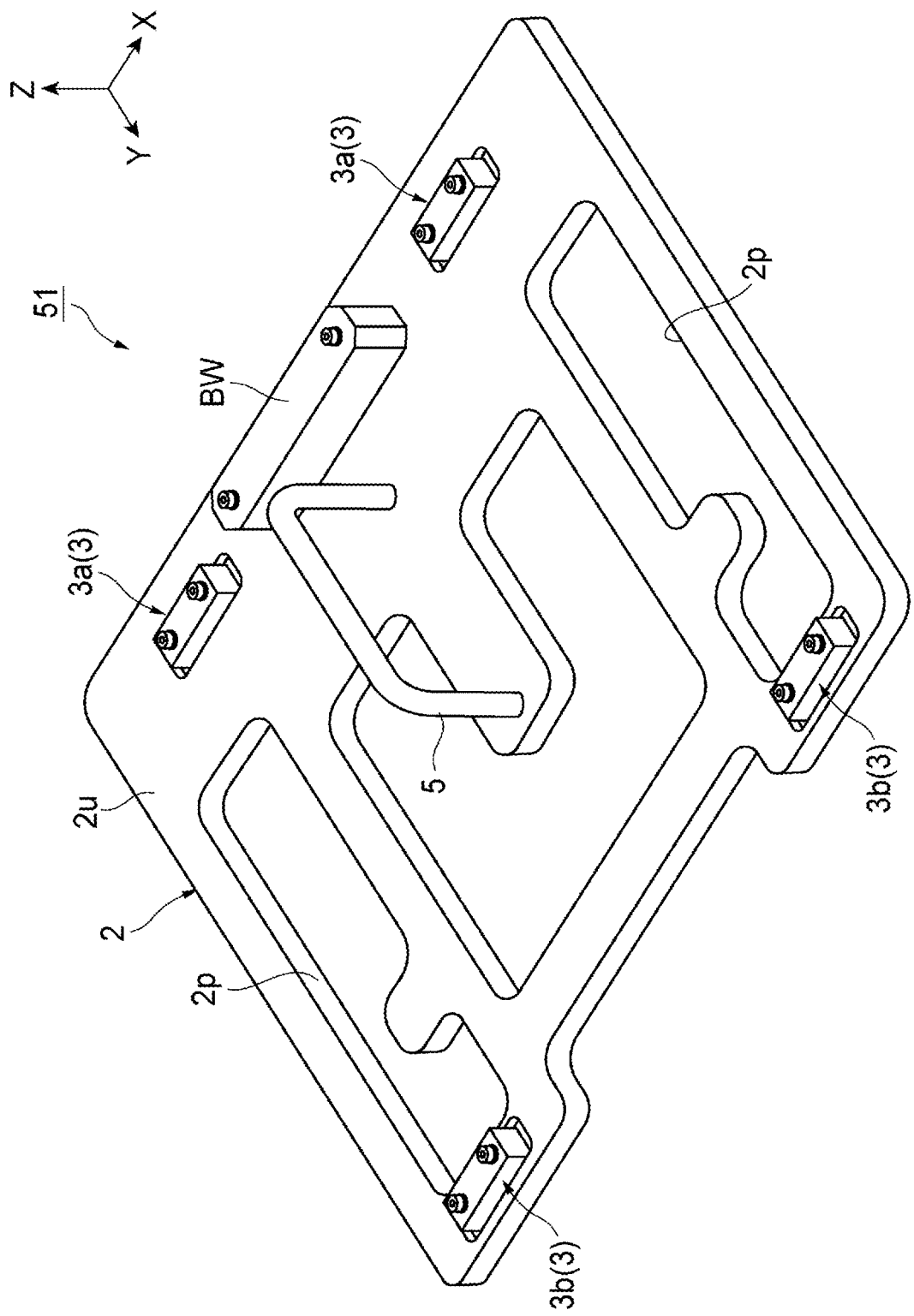
FIG. 6 is a perspective view of a flatness measurement unit according to a second embodiment when viewed from above.
Figure 7:
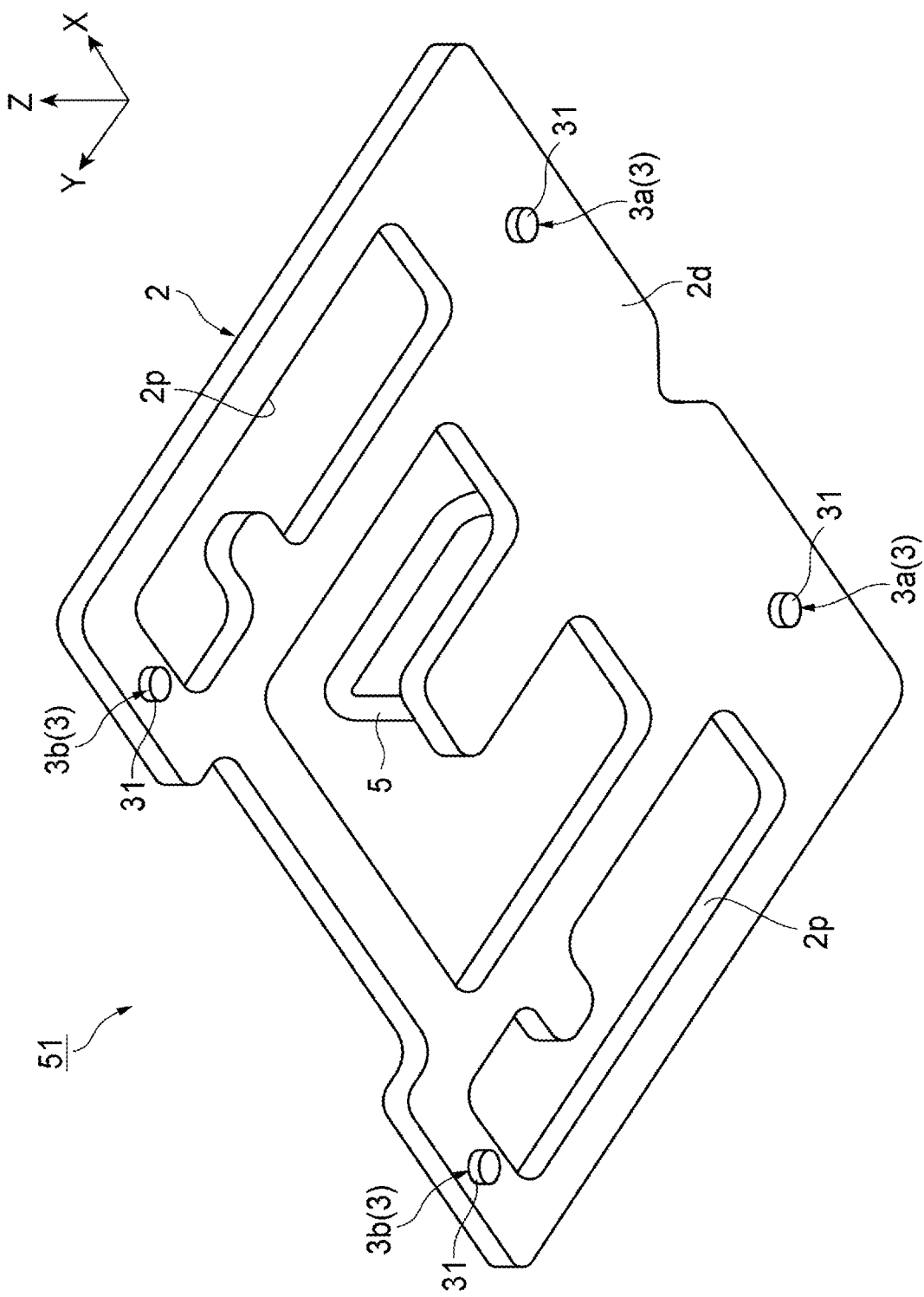
FIG. 7 is a perspective view of the flatness measurement unit according to the second embodiment when viewed from below.
Figure 8:
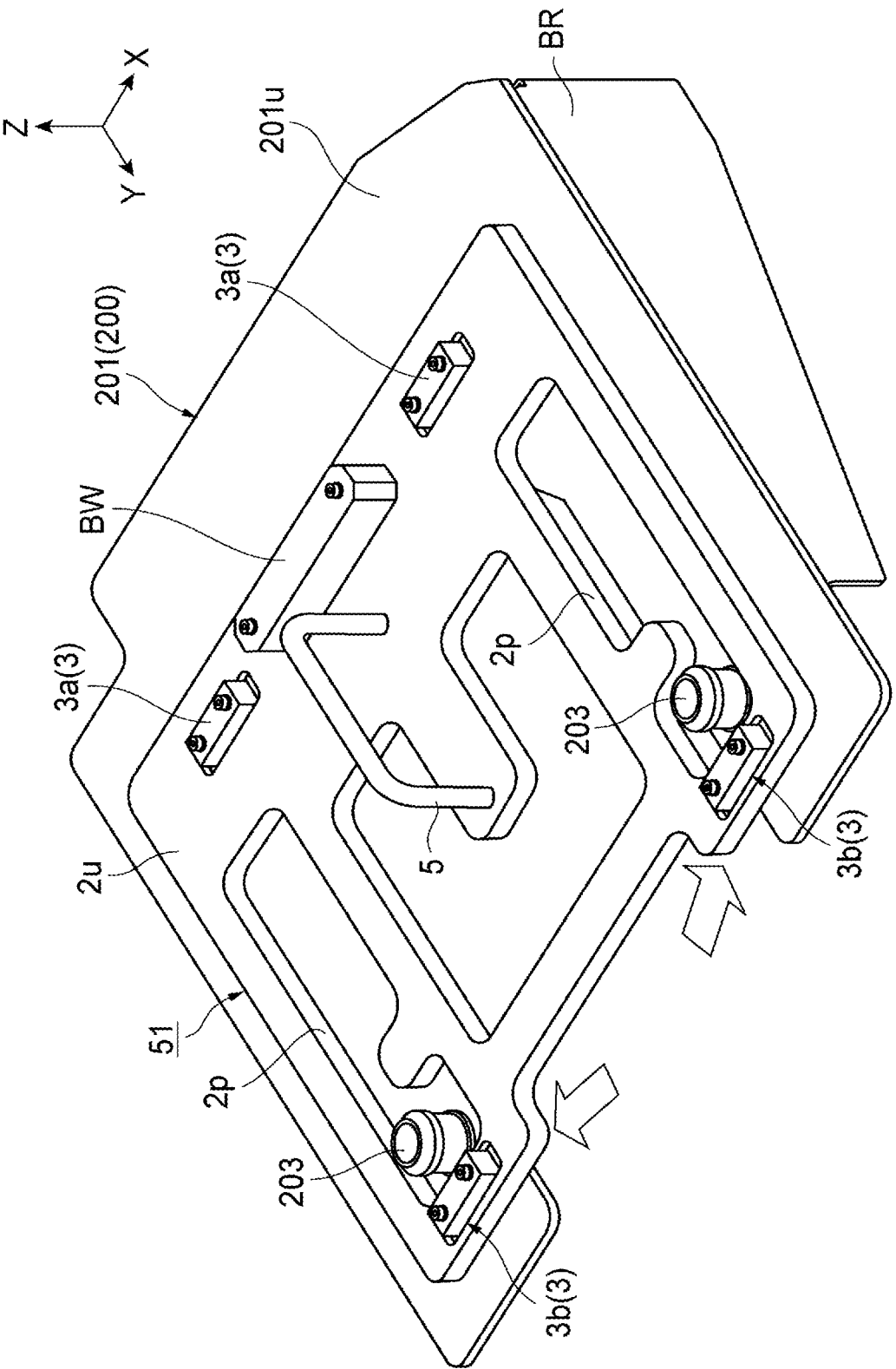
FIG. 8 is a perspective view illustrating a state in which the flatness measurement unit according to the second embodiment is placed on a shelf.

FIG. 6 is a perspective view of a flatness measurement unit 51 when viewed from above. FIG. 7 is a perspective view of the flatness measurement unit 51 when viewed from below. FIG. 8 is a perspective view illustrating the flatness measurement unit 51 placed on a shelf 201. As illustrated in FIG. 6 to FIG. 8, the flatness measurement unit 51 according to the present embodiment is placed on the shelf 201 that constitutes a purge shelf of a purge stocker 200.

On the shelf 201, two nozzles 203 protruding upward are provided. The nozzles 203 circulate purge gas to and from a storage container placed on the shelf 201. The nozzles 203 each have a structure with a built-in spring. The nozzles 203 are disposed at two points on the front side of the shelf 101 when viewed from above. On the shelf 201, the storage container is supported with its front side placed on the upper surfaces of the two nozzles 203 and its rear side placed on an upper surface 201u of the shelf 201.

In the present embodiment, two front points adjacent to the nozzles 203 on the upper surface 201u of the shelf 201 and two rear points on the upper surface 201u of the shelf 201 correspond to four predetermined points the flatness at which is to be measured by the flatness measurement unit 51. In other words, because the nozzles 203 each have the structure with a built-in spring and are easily deformed, the four predetermined points relating to the flatness to be measured do not include the upper surfaces of the two nozzles 203, but instead include the two points adjacent to the nozzles 203 on the upper surface 201u. In some cases, the upper surfaces of the two nozzles 203 may be included in the four predetermined points.

In the flatness measurement unit 51, the body frame 2 is a plate member having a rectangular outline when viewed from above. In the flatness measurement unit 51, the first contact sections 3a are disposed at two rear points in the body frame 2. The second contact sections 3b are disposed at two front points in the body frame 2. The flatness measurement unit 51 includes a balance weight BW. The balance weight BW is a block-shaped weight. The balance weight BW is provided on a side of the upper surface 2u of the body frame 2 closer to the first contact sections 3a (rear side in the illustrated example).

The flatness measurement unit 51 does not include the measuring devices 4, the battery 8, the data logger 9, the indicators 10, and the transformer 11 (see FIG. 2). In the flatness measurement unit 51, openings 2p are formed in the body frame 2. The openings 2p are holes penetrating vertically through the body frame 2. The openings 2p allow the nozzles 203 to pass (be inserted) therethrough when the flatness measurement unit 51 is placed on the shelf 201. The openings 2p are formed in both end portions of the body frame 2 in the X-direction so as to contain the two front points corresponding to the nozzles 203 of the shelf 101.

The weight on the side closer to the first contact sections 3a in the flatness measurement unit 51 is heavier than the weight on the side closer to the second contact sections 3b. In other words, the rear side of the flatness measurement unit 51 is heavier than the front side. The flatness measurement unit 51 is configured such that the center of gravity G is shifted rearward from the center in the Y-direction when viewed from above.

As illustrated in FIG. 8, the flatness measurement unit 51 thus configured is placed on the shelf 201 such that the protrusions 31 of the first contact sections 3a are in contact with two rear points on the upper surface 201u and the protrusions 31 of the second contact sections 3b are in contact with two front points adjacent to the nozzles 203 on the upper surface 201u. The nozzles 203 of the shelf 201 are inserted into the openings 2p of the body frame 2. Herein, because the side closer to the first contact sections 3a in the flatness measurement unit 51 is heavier than the side closer to the second contact sections 3b, a gap can be formed between any one of the two second contact sections 3b and the upper surface 201u. Thus, whether a gap gauge 56 can be inserted between any one of the protrusions 31 of the two second contact sections 3b and the upper surface 201u is checked, and the amount of the corresponding gap (thickness of the gap gauge 56) is measured as the flatness (see arrows in FIG. 8, and FIG. 9).

As described above, the flatness measurement unit 51 also has the same effect as the above-described embodiment, i.e., the effect of making it possible to easily perform the operation of measuring the flatness on the shelf 201.

Figure 9:
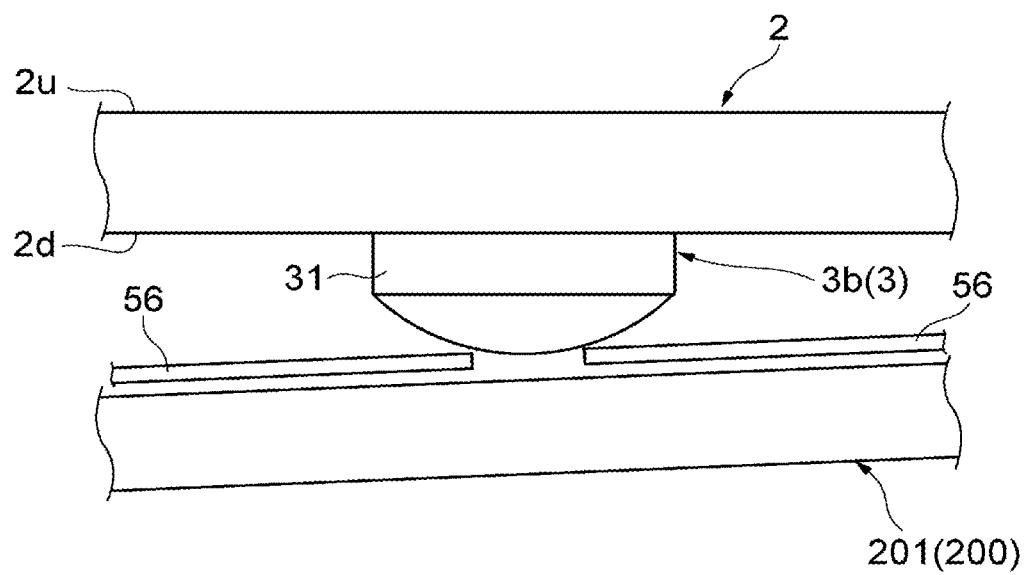
FIG. 9 is a side view schematically illustrating of an area around a second contact section when the flatness measurement unit according to the second embodiment is placed on the shelf.

In the flatness measurement unit 51, each second contact section 3b has the protrusion 31 forming a spherical contact surface as illustrated in FIG. 9. Thus, for example, when the gap amount is measured with the gap gauge 56, the minimum gap between the protrusion 31 of the second contact section 3b and the upper surface 201u of the shelf 201 can be easily measured from any direction. In other words, the thickness of the gap gauge 56 that can be inserted can be prevented from varying depending on the direction in which the gap gauge 56 is inserted.

In the flatness measurement unit 51, the balance weight BW is provided on the side of the body frame 2 closer to the first contact sections 3a. In this case, it is possible to reliably achieve a configuration in which the side closer to the first contact sections 3a in the flatness measurement unit 51 is heavier than the side closer to the second contact sections 3b.

In the flatness measurement unit 51, the body frame 2 has the openings 2p through which the nozzles 203 pass when the flatness measurement unit 51 is placed on the shelf 201. In this configuration, when the flatness measurement unit 51 is placed on the shelf 201, contact with the nozzles 203 can be avoided by using the openings 2p.

With the flatness measurement unit 51, the gap between each second contact section 3b that is a front (frontal) contact section 3 and the shelf 201 is measured. By setting the front one as a measurement point in this manner, the gap gauge 56 can be inserted more easily. By positioning the center of gravity G at an optional position, the measurement point can be set at the optional position. Because the flatness measurement unit 51 does not include the measuring devices 4 or the like, the configuration thereof can be simplified.

Third Embodiment

The following describes a third embodiment. In description of the present embodiment, points different from the second embodiment above will be described.

Figure 10:
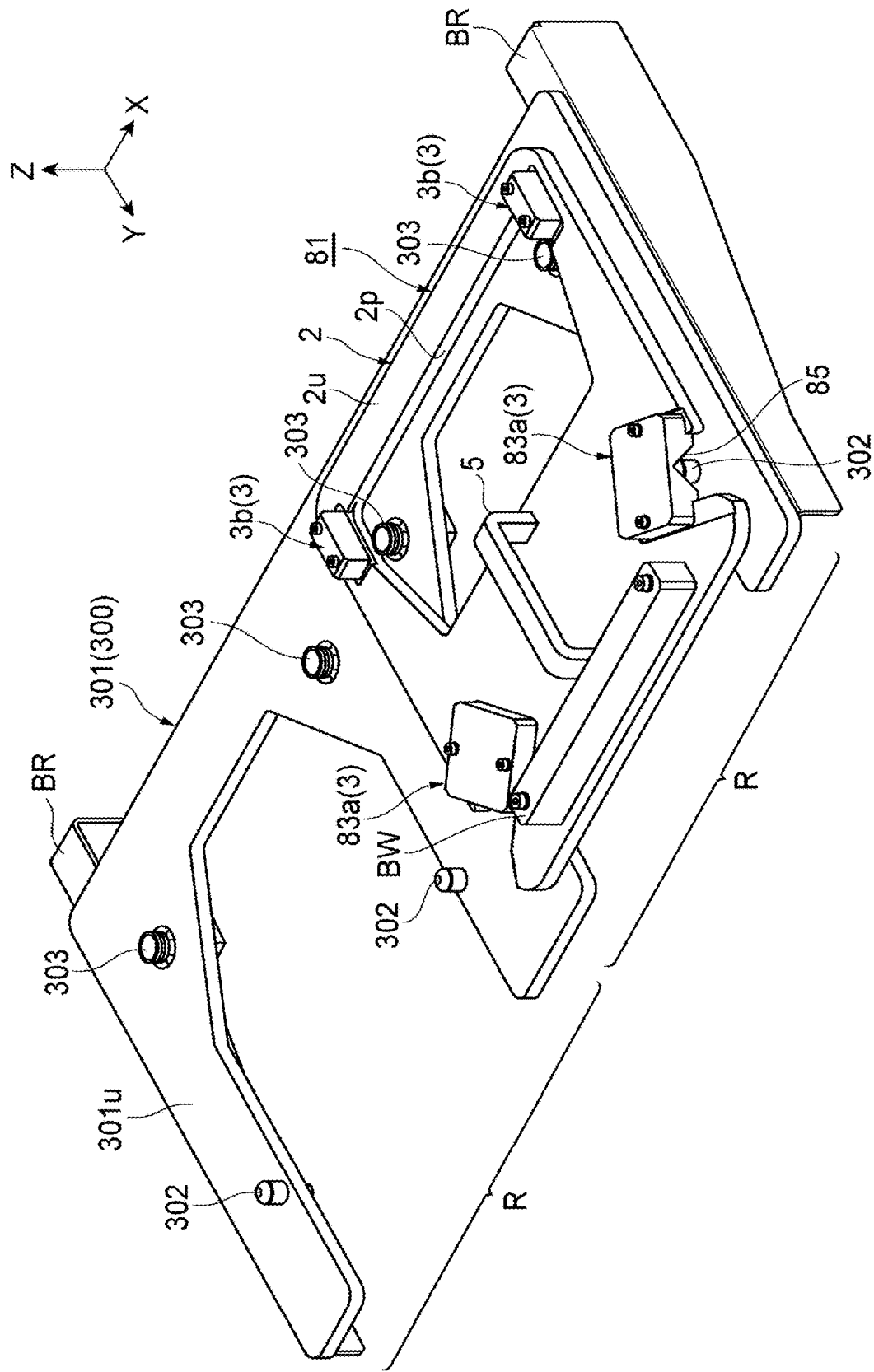
FIG. 10 is a perspective view illustrating a state in which a flatness measurement unit according to a third embodiment is placed on a shelf.
Figure 11:
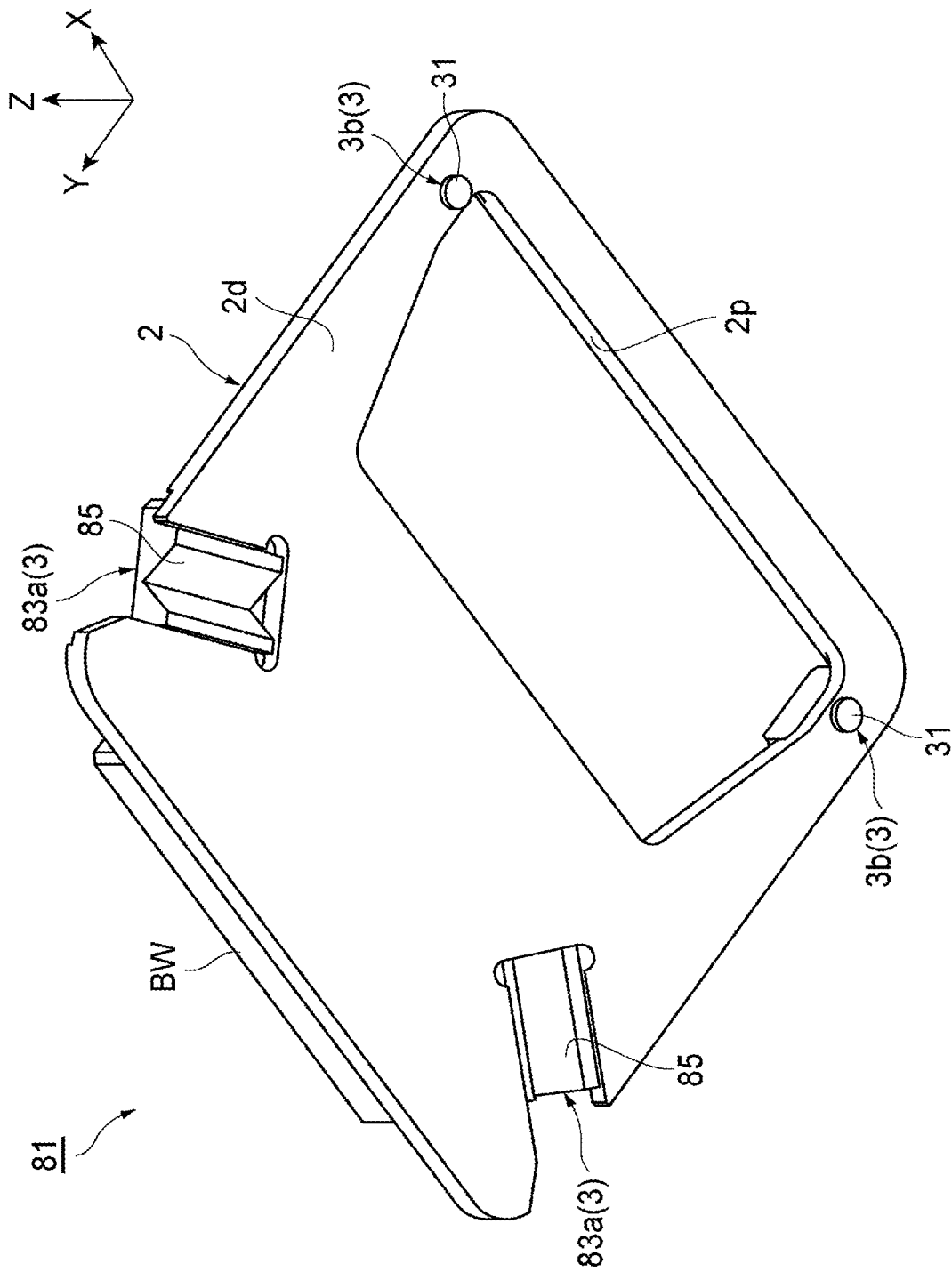
FIG. 11 is a perspective view of the flatness measurement unit according to the third embodiment when viewed from below.

FIG. 10 is a perspective view illustrating a flatness measurement unit 81 placed on a shelf 301. FIG. 11 is a perspective view of the flatness measurement unit 81 when viewed from below. As illustrated in FIG. 10 and FIG. 11, the flatness measurement unit 81 according to the present embodiment is placed on the shelf 301 that constitutes a purging shelf of a purging stocker 300.

In the shelf 301, two placement spots R for storage containers are provided so as to be aligned in the X-direction.

The shelf 301 has openings that are open forward when viewed from above at the respective two placement spots R. On the shelf 301, two nozzles 303 protruding upward are provided to each of the two placement spots R. The nozzles 303 circulate purge gas to and from storage containers placed on the shelf 301. The nozzles 303 have a pleated structure made of rubber. In the illustrated example, the nozzles 303 are disposed at two rear points on the shelf 301 in each of the two placement spots R.

On the shelf 301, two pins 302 protruding upward are provided in each of the two placement spots R. The pins 302 are kinematic pins and have a function of positioning the storage containers. In the illustrated example, the pins 302 are disposed at two front points of the shelf 301 when viewed from above, in each of the two placement spots R. On each of the placement spots R of the shelf 301, the corresponding storage container is supported with its front side placed on the two pins 302 and with its rear side placed on the upper surfaces of the corresponding two nozzles 303.

In the present embodiment, two rear points adjacent to the nozzles 303 on an upper surface 301u of the shelf 301 and the two pins 302 of the shelf 301 correspond to the four predetermined points the flatness at which is to be measured by the flatness measurement unit 81. Specifically, because the nozzles 303 have a pleated structure and are easily deformed, the four predetermined points for the flatness do not include the upper surfaces of the two nozzles 303, but instead include the two points adjacent to the nozzles 303 on the upper surface 301u. In some cases, the upper surfaces of the two nozzles 303 may be included in the four predetermined points.

The flatness measurement unit 81 has first contact sections 83a in place of the first contact sections 3a (see FIG. 6). Each first contact section 83a is a block-shaped member having a V-groove (groove) 85 that is open downward and extends in the horizontal direction. The V-groove 85 is a groove having a V-shaped cross section having an inner surface as a contact surface. The first contact sections 83a are provided at two front points in the body frame 2 such that the V-grooves 85 are exposed downward. The first contact sections 83a are fastened with screws, for example, on the upper surface 2u side of the body frame 2. The first contact sections 83a are provided at positions corresponding to the respective two pins 302. The first contact sections 83a are disposed on the pins 302 such that the V-grooves 85 are in contact with the pins 302 when the flatness measurement unit 81 is placed on the shelf 101.

In the flatness measurement unit 81, the second contact sections 3b are disposed at two rear points in the body frame 2. In the flatness measurement unit 81, the balance weight BW is provided on a side of the upper surface 2u of the body frame 2 closer to the first contact sections 3a (front side in the illustrated example). In the flatness measurement unit 81, an opening 2p formed in the body frame 2 allows the nozzles 303 to pass (be inserted) therethrough when the flatness measurement unit 51 is placed on the shelf 201. The opening 2p is formed on the rear side of the body frame 2.

The weight on the side closer to the first contact sections 3a in the flatness measurement unit 81 is heavier than the weight on the side closer to the second contact sections 3b. In other words, the front side of the flatness measurement unit 81 is heavier than the rear side. The flatness measurement unit 81 is configured such that the center of gravity G is shifted forward from the center in the Y-direction when viewed from above.

The flatness measurement unit 81 thus configured is placed on the shelf 301 such that the V-grooves 85 of the first contact sections 83a are in contact with the two pins 302 and the protrusions 31 of the second contact sections 3b are in contact with the two rear points adjacent to the nozzles 303 on the upper surface 301u. The nozzles 303 of the shelf 301 are inserted into the opening 2p of the body frame 2. Herein, because the side closer to the first contact sections 83a in the flatness measurement unit 81 is heavier than the side closer to the second contact sections 3b, a gap can be formed between any one of the two second contact sections 3b and the upper surface 301u. Thus, whether the gap gauge 56 (see FIG. 9) can be inserted between any one of the protrusions 31 of the two second contact sections 3b and the upper surface 301u is checked, and the amount of the corresponding gap is measured as the flatness.

As described above, the flatness measurement unit 81 has the same effect as the other embodiments, i.e., the effect of making it possible to easily perform the operation of measuring the flatness on the shelf 301.

In the flatness measurement unit 81, each first contact section 83a has the V-groove 85 having an inner surface as the contact surface. In this configuration, the first contact section 83a can be reliably brought into contact with even the corresponding pin 302 (a portion protruding upward) on the shelf 301.

Fourth Embodiment

The following describes a fourth embodiment. In description of the present embodiment, explanations overlapping those of the first embodiment above are omitted as appropriate.

Figure 12:
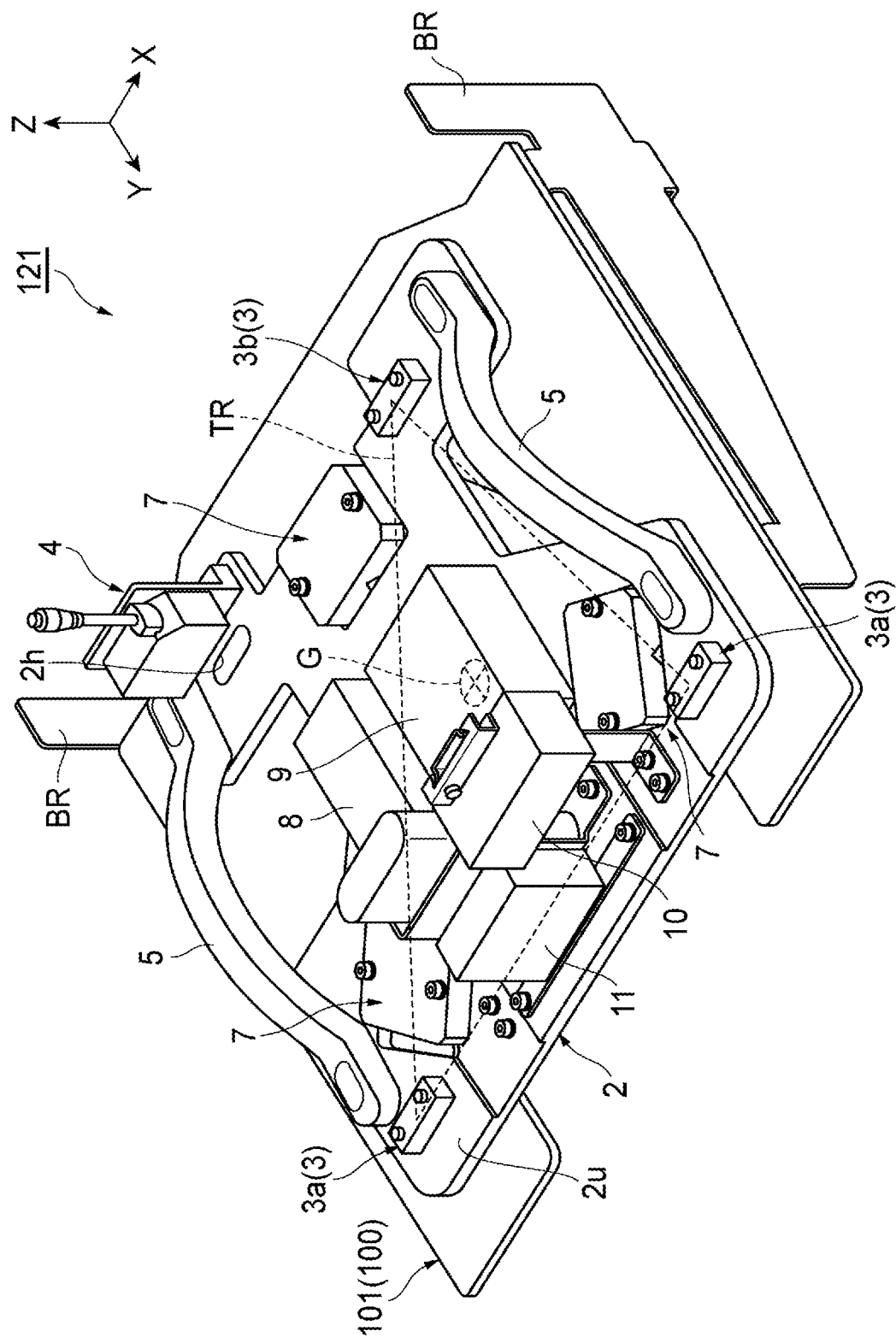
FIG. 12 is a perspective view illustrating a state in which a flatness measurement unit according to a fourth embodiment is placed on a shelf.
Figure 13:
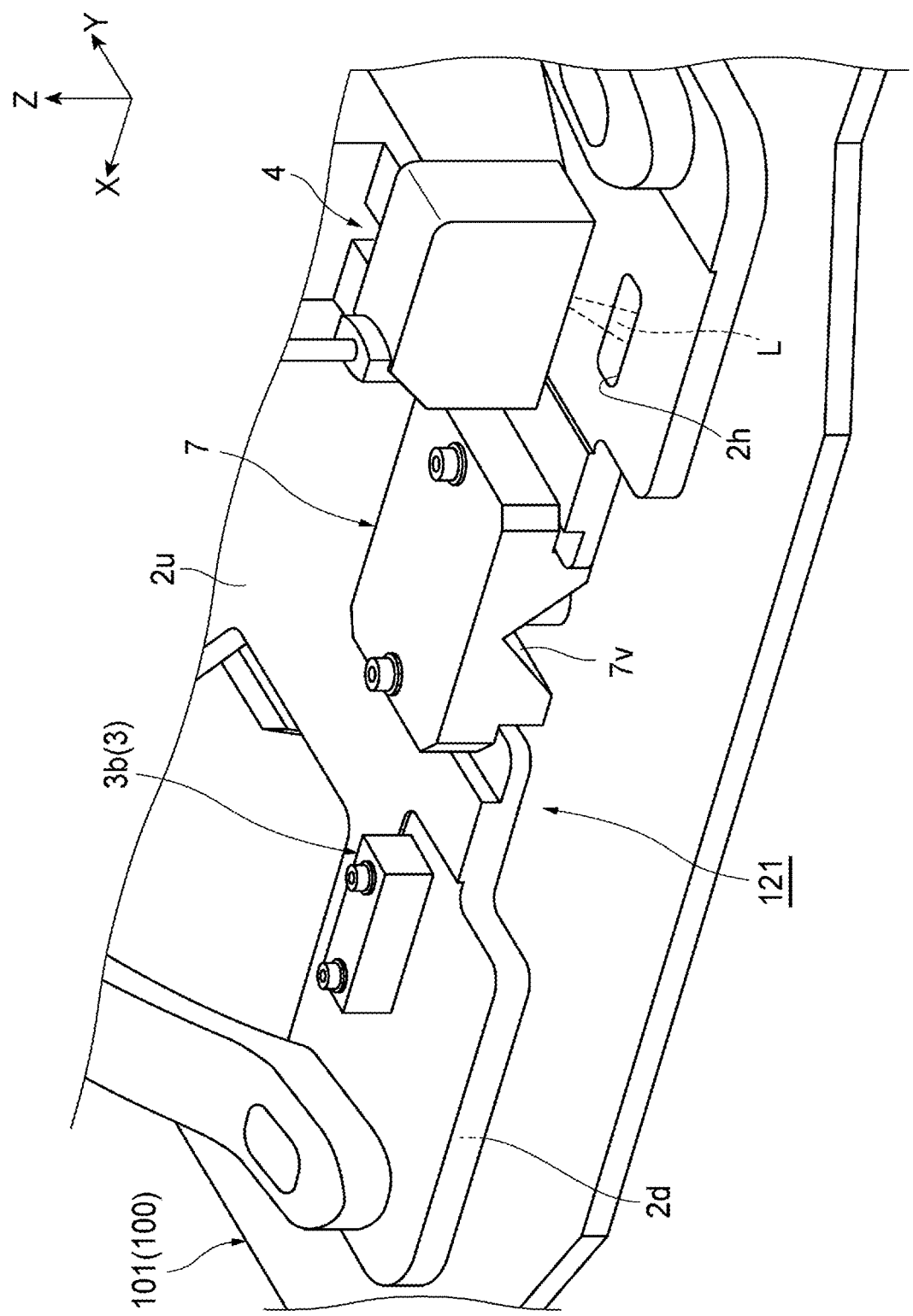
FIG. 13 is a perspective view illustrating a rear side of the flatness measurement unit according to the fourth embodiment.

FIG. 12 is a perspective view illustrating a flatness measurement unit 121 placed on a shelf 101. FIG. 13 is a perspective view illustrating a rear side of the flatness measurement unit 121. As illustrated in FIG. 12 and FIG. 13, the flatness measurement unit 121 is a unit to be placed on the shelf 101 for measuring the flatness on the shelf 101. Similarly to the first embodiment above, the flatness measurement unit 121 includes the body frame 2, contact sections 3, a measuring device 4, the handles 5, the guide members 7, the battery 8, the data logger 9, an indicator 10, and the transformer 11.

Three contact sections 3 according to the present embodiment are dispersedly disposed on the body frame 2. The contact sections 3 are provided so as to be in contact with the respective three nozzles 103 out of the four nozzles 103 of the shelf 101. The contact sections 3 are provided at positions in the body frame 2 corresponding to the three nozzles 103. The three contact sections 3 include two first contact sections 3a and one second contact section 3b. The first contact sections 3a are disposed at two front points in the body frame 2. The second contact section 3b is disposed at one rear point in the body frame 2. The second contact section 3b is disposed at a separated position on the rear side of any one of the two first contact sections 3a. The apexes (lower end point) of the protrusions 31 in the three contact sections 3 are located on the same plane.

The measuring device 4 according to the present embodiment measures the distance to the remaining nozzle 103 other than the three nozzles 103 with which the respective three contact sections 3 are in contact on the shelf 101 (hereinafter simply referred to as "remaining nozzle 103") when the flatness measurement unit 121 is placed on the shelf 101. The measuring device 4 is provided at a position away from the second contact section 3b in the X-direction on the rear side of the body frame 2. The measuring device 4 measures the distance to the upper surface of the remaining nozzle 103 with which any contact section 3 is not in contact. The measuring device 4 emits measurement light L downward, and measures the distance to the upper surface of the remaining nozzle 103 by emitting the measurement light L downward and receiving its reflected light reflected from the upper surface of the remaining nozzle 103 through the measurement through-hole 2h formed in the body frame 2. The measuring device 4 is not limited to a particular one, and various known devices can be used. As the measuring device 4, for example, a dial gauge may be used. The indicator 10 according to the present embodiment is provided according to the number of measuring devices 4, and in this case, one is provided. The indicator 10 is fixed on the upper surface 2u of the body frame 2, on the front side and on one side in the X-direction.

Figure 14:
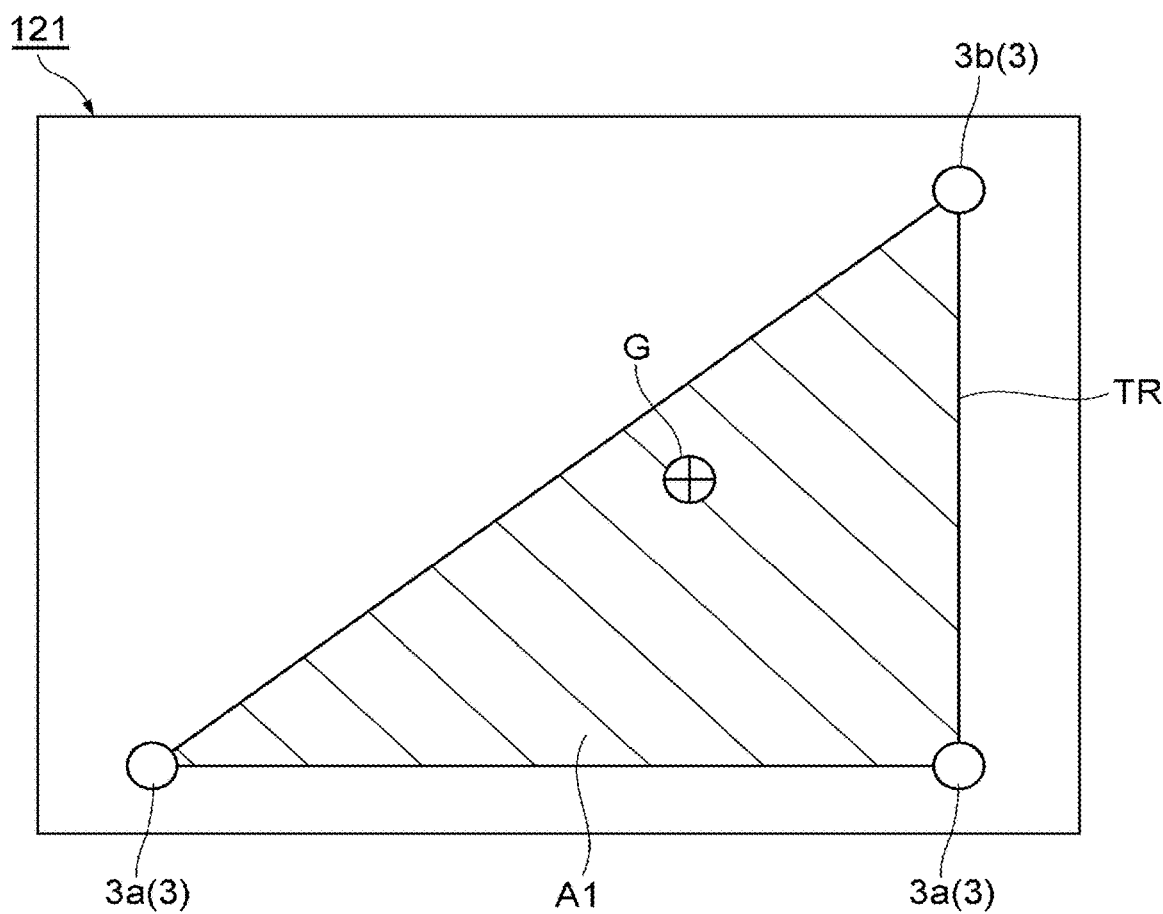
FIG. 14 is a plan view schematically illustrating the flatness measurement unit according to the fourth embodiment.

In the present embodiment, as illustrated in FIG. 12 and FIG. 14, the center of gravity G of the flatness measurement unit 121 is positioned inside the area A1 of the triangle TR having vertices at the respective three contact sections 3 in the flatness measurement unit 121. In other words, the weight of the side on which the measuring device 4 of the flatness measurement unit 121 is provided is lighter than the weight of its diagonal side. As can be seen in the figure, the center of gravity G is positioned within the area A1 of the triangle TR that is an area enclosed by the three contact sections 3 in plan view.

The following describes an example of using the flatness measurement unit 121 to measure the flatness on the shelf 101 of the purge stocker 100.

On the shelf 101, because the ventilation ports (purge port surfaces) of the storage container to be placed need to be brought into close contact with the four nozzles 103, the flatness at the upper surfaces of the four nozzles 103 is measured. To begin with, the operator places the flatness measurement unit 121 on a plate and zero-resets the measuring device 4 with all three contact sections 3 being in contact with the plate. The operator grips the handles 5 and places the flatness measurement unit 121 on a loading-and-unloading port (not illustrated) of the purge stocker 100. The operator starts measurement of the measuring device 4 and starts recording measurement results in the data logger 9. Thereafter, the measurement results of the measuring device 4 continue to be recorded by the data logger 9 until the recording is stopped in the data logger 9.

Subsequently, the operator sets a source and a destination of transfer by a crane robot (not illustrated) in the purge stocker 100, and starts the transfer of the flatness measurement unit 121 by the crane robot. Thus, the flatness measurement unit 121 is transferred from the loading-and-unloading port onto the shelf 101 such that the contact sections 3 are in contact with the upper surfaces of the three nozzles 103.

Herein, the center of gravity G of the flatness measurement unit 121 is positioned inside the area A1 of the triangle TR having vertices at the respective three contact sections 3. Thus, when the flatness measurement unit 121 is placed on the shelf 101, there is no possibility that a gap is formed between each of the three contact sections 3 and the upper surface of the corresponding nozzle 103, and the three contact sections 3 are reliably brought into contact with the upper surfaces of the nozzles 103. In this state, the flatness measurement unit 121 is stable. The gap amount between the flatness measurement unit 121 and the upper surface of the remaining nozzle 103 with which any contact section 3 is not in contact is measured as the flatness by the measuring device 4. After a certain period of time when the measurement results of the measuring device 4 stabilize, the flatness measurement unit 121 is transferred to the next shelf 101 by the crane robot.

If the gap amount measured by the measuring device 4 is a specified amount, it can be determined that a plane formed by the upper surfaces of the four nozzles 103 is flat, and the flatness is zero. If the gap amount measured by the measuring device 4 is not the specified amount, it can be determined that a plane formed by the upper surfaces of the four nozzles 103 is not flat, and the flatness is determined based on the degree of deviation of the gap amount from the specified amount. The specified amount is a gap amount when the flatness is zero, which is determined in advance.

Subsequently, the measurement and transfer described above are repeated for the number of a plurality of the shelves 101. When the measurement of the flatness has been completed for all shelves 101, the flatness measurement unit 121 is returned onto the loading-and-unloading port by the crane robot. The operator stops recording of the data logger 9 and retrieves the recorded data from the data logger 9. Because the recorded data is continuous data from the time of the placement on the loading-and-unloading port to the time of the return, the data is checked against settings of the transfer source and the transfer destination, whereby which part of the data is associated with the flatness of which one of the shelves 101. By the processes described above, the measurement of the flatness for each of the shelves 101 of the purge stocker 100 is completed. Thereafter, if necessary, for example, each shelf 101 is adjusted based on the measured flatness.

As described above, when the flatness measurement unit 121 is placed on the shelf 101, the three contact sections 3 are always in contact with the upper surfaces of the corresponding nozzles 103 of the shelf 101 because the center of gravity G is positioned inside the area A1 of the triangle TR having vertices at the respective three contact sections 3. In this case, because a perfect plane is defined by three points, when the upper surfaces of the four nozzles 103 are present on the same plane, a gap of a specified amount is formed between one, with which any contact section 3 is not in contact, of the upper surfaces of the four nozzles 103 and the flatness measurement unit 121. Thus, the value of this gap can be measured as the flatness. Because one measurement point can be designated, time and labor in measuring the flatness on the shelf 101 can be saved. Thus, the operation of measuring the flatness on the shelf 101 can be easily performed.

The flatness measurement unit 121 includes the measuring device 4 provided on the body frame 2. The measuring device 4 measures the distance to the upper surface of the remaining nozzle 103 with which any contact section 3 on the shelf 101 is not in contact when the flatness measurement unit 121 is placed on the shelf 101. In this configuration, operation of measuring the flatness on the shelf 101 can be performed more easily with reduced manpower. Herein, only one measuring device 4 is enough.

Fifth Embodiment

The following describes a fifth embodiment. In description of the present embodiment, points different from the second embodiment above will be described.

Figure 15:
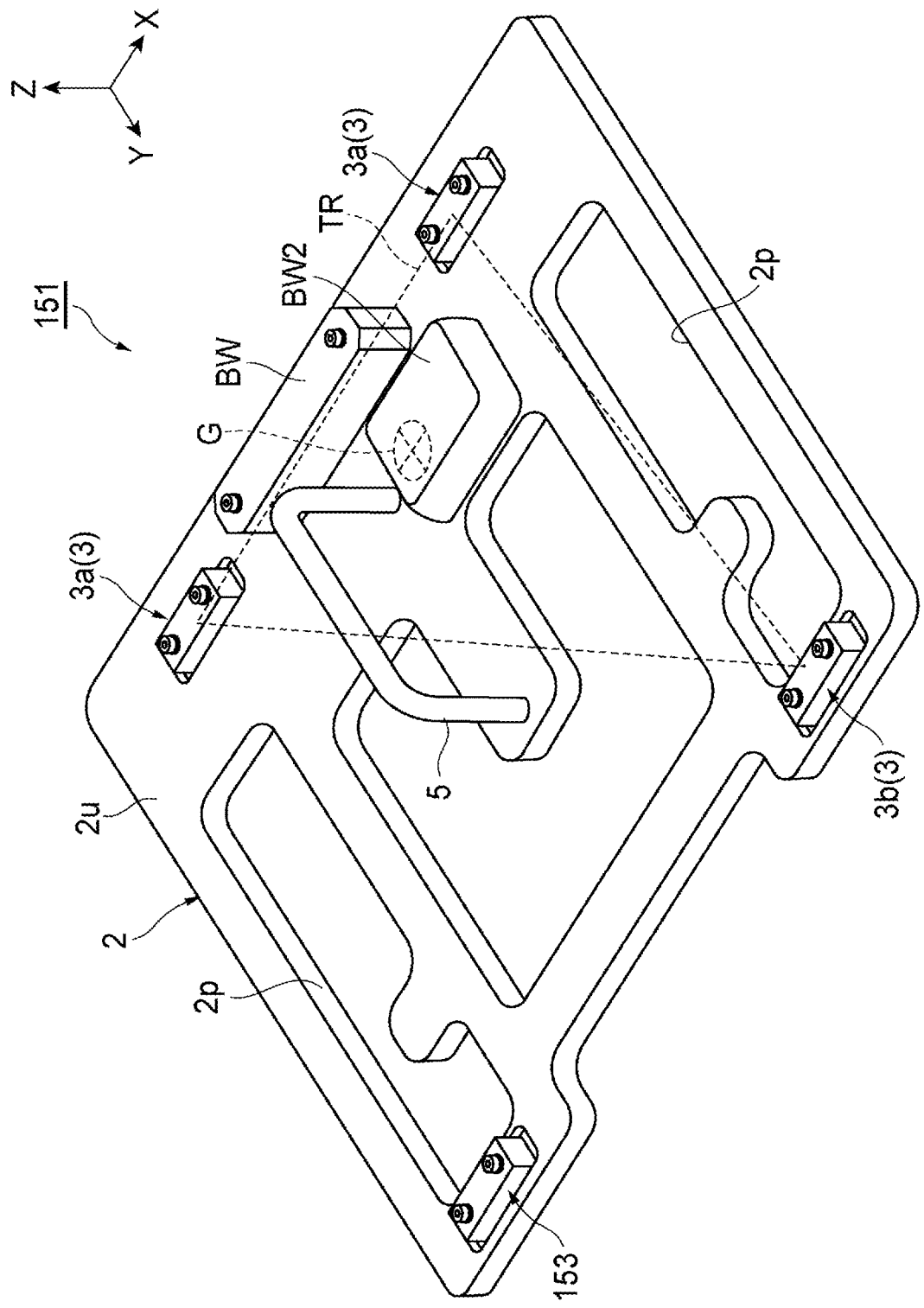
FIG. 15 is a perspective view of the flatness measurement unit according to a fifth embodiment when viewed from above.
Figure 16:
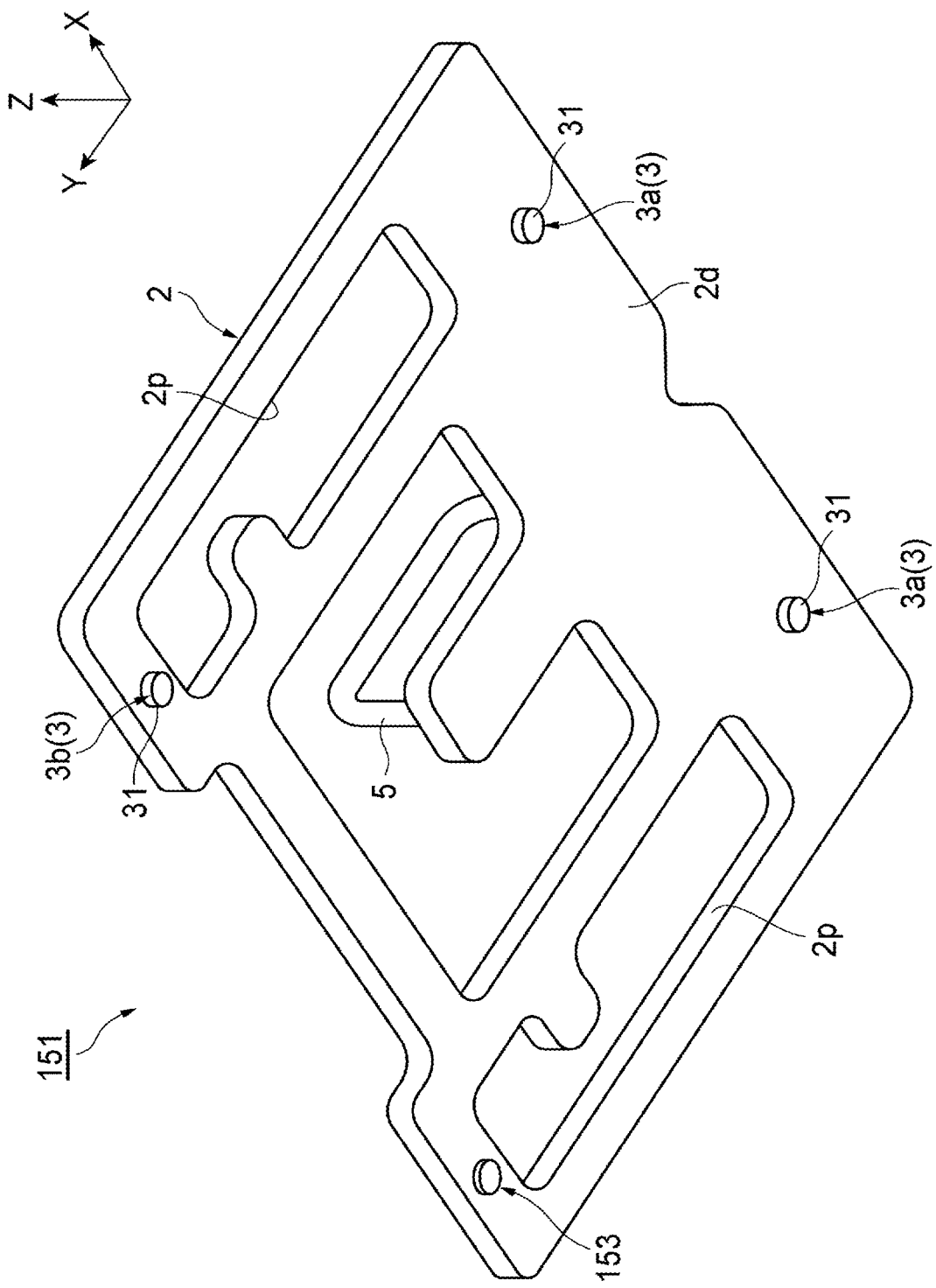
FIG. 16 is a perspective view of the flatness measurement unit according to the fifth embodiment when viewed from below.
Figure 17:
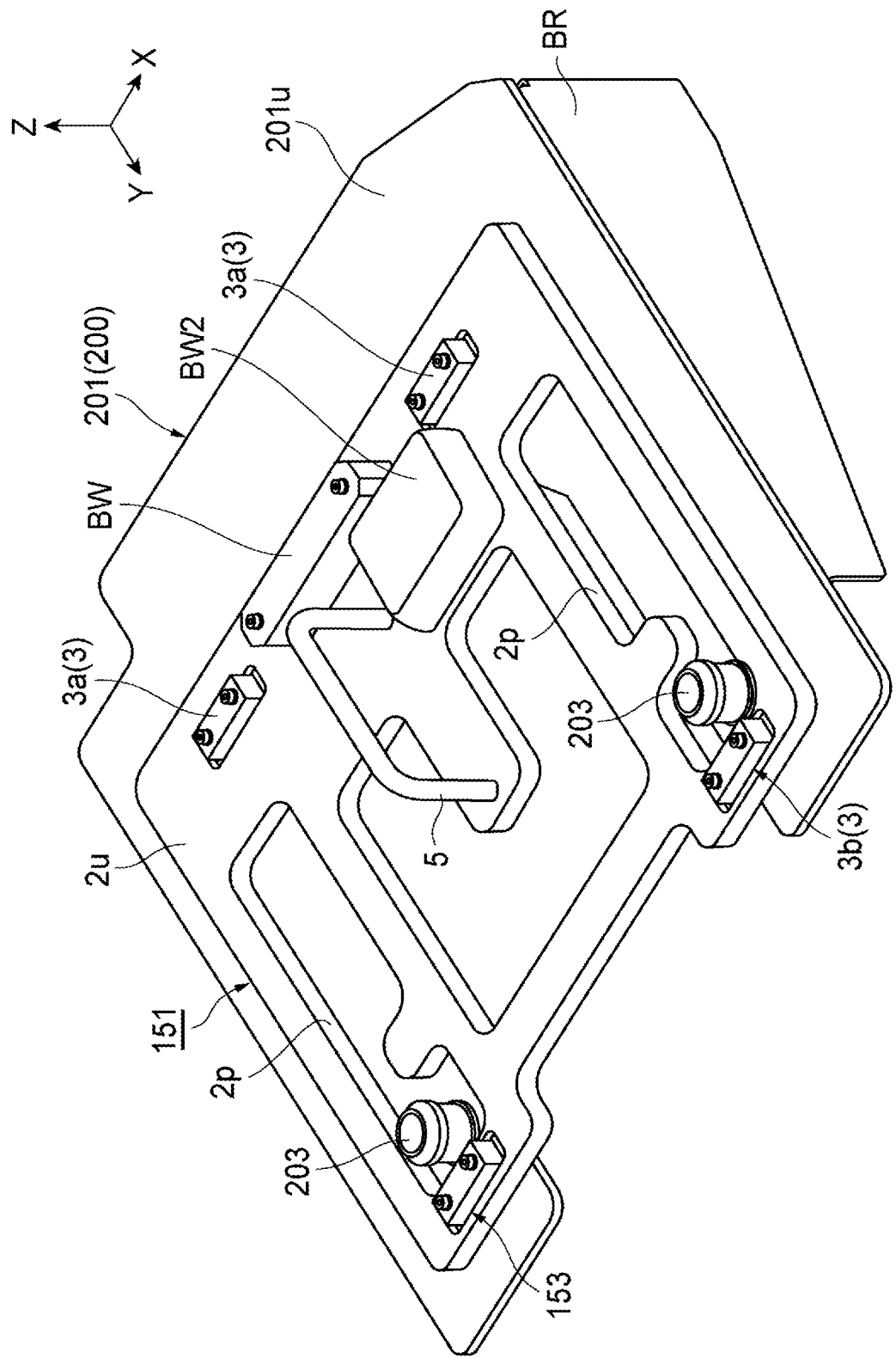
FIG. 17 is a perspective view illustrating a state in which the flatness measurement unit according to the fifth embodiment is placed on a shelf.

FIG. 15 is a perspective view of a flatness measurement unit 151 when viewed from above. FIG. 16 is a perspective view of the flatness measurement unit 151 when viewed from below. FIG. 17 is a perspective view illustrating the flatness measurement unit 151 placed on the shelf 201. As illustrated in FIG. 15 to FIG. 17, the flatness measurement unit 151 according to the present embodiment is placed on the shelf 201 that constitutes a purge shelf of the purge stocker 200.

In the present embodiment, two front points adjacent to the two nozzles 203 on the upper surface 201$u$ of the shelf 201 and two rear points on the upper surface 201$u$ of the shelf 201 correspond to the four predetermined points the flatness at which is to be measured by the flatness measurement unit 151. In the flatness measurement unit 151, the three contact sections 3 are dispersedly disposed on the body frame 2. The contact sections 3 are each provided so as to be in contact with one front point adjacent to one of the nozzles 203 on the upper surface 201$u$ and with two rear points on the upper surface 201$u$. The three contact sections 3 include two first contact sections 3$a$ and one second contact section 3$b$. The first contact sections 3$a$ are disposed at the two rear points in the body frame 2. The second contact section 3$b$ is disposed at the one front point in the body frame 2. The second contact section 3$b$ is disposed at a separated position on the front side of any one of the two first contact sections 3$a$.

The flatness measurement unit 151 further includes a balance weight BW2. The balance weight BW2 is a block-shaped weight. The balance weight BW2 is provided in an area inside the area of a triangle TR having vertices at the respective three contact sections 3 on the upper surface 2u of the body frame 2.

The flatness measurement unit 151 includes a measurement protrusion 153 disposed on the body frame 2. The measurement protrusion 153 is provided at a position corresponding to the remaining predetermined point out of the four predetermined points on the shelf 201 other than the three predetermined points in contact with the three contact sections 3 (herein, one front point adjacent to the other nozzle 203, also referred to simply as "remaining predetermined point"). The measurement protrusion 153 is disposed at a separated position on the front side of any other of the two first contact sections 3a. The measurement protrusion 153 is provided in a manner protruding from the lower surface 2d of the body frame 2.

The measurement protrusion 153 is configured such that a gap is formed between the measurement protrusion 153 and the remaining predetermined point when the flatness measurement unit 151 is placed on the shelf 201. The height (protruding length) of the measurement protrusion 153 is lower than the plane defined by (passing through the apexes of) the apexes of the respective protrusions 31 of the three contact sections 3. The distance between the apex of the measurement protrusion 153 and the plane defined by the apexes of the respective protrusions 31 of the three contact sections 3 may be equal to or greater than a maximum deviation amount. The maximum deviation amount is the amount of a gap between the measurement protrusion 153 and the remaining predetermined point when the flatness is the largest (most deviated from the plane) among assumed cases. The maximum deviation amount is a predetermined value that can be determined in advance by calculation, testing, and/or experience, for example.

The center of gravity G of the flatness measurement unit 151 is positioned inside the area of the triangle TR having vertices at the respective three contact sections 3 in the flatness measurement unit 151. In other words, the weight of the flatness measurement unit 151 on the side on which the measurement protrusion 153 is provided is lighter than the weight on its diagonal side. As can be seen in the figure, the center of gravity G is positioned within the area of the triangle TR that is an area enclosed by the three contact sections 3 in plan view.

The flatness measurement unit 151 is placed on the shelf 201 such that the protrusions 31 of the first contact sections 3a are in contact with two rear points on the upper surface 201u and the protrusion 31 of the second contact section 3b is in contact with one front point adjacent to the corresponding nozzle 203 on the upper surface 201u. The nozzles 203 of the shelf 201 are inserted into the openings 2p of the body frame 2. Herein, in the flatness measurement unit 151, because a gap is formed between the measurement protrusion 153 and the upper surface 201u, the gap is checked with a gap gauge, and the flatness is measured based on this check result. For example, when a gap gauge of the specified amount can be fittingly inserted, the four predetermined points are determined to be flat. When a gap gauge thicker than the specified amount can be inserted, or when only a gap gauge thinner than the specified amount can be inserted, the four predetermined points are determined to be nonflat.

As described above, the flatness measurement unit 151 also has the same effect as the above-described embodiment, i.e., the effect of making it possible to easily perform the operation of measuring the flatness on the shelf 201.

The flatness measurement unit 151 includes the measurement protrusion 153. The measurement protrusion 153 is configured such that a gap is formed between the measurement protrusion 153 and the remaining predetermined point when the flatness measurement unit 151 is placed on the shelf 201. This allows the flatness to be measured based on the gap between the measurement protrusion 153 and the remaining predetermined point.

In the flatness measurement unit 151, the height of the measurement protrusion 153 is lower than the plane defined by the apexes of the respective protrusions 31 of the three contact sections 3. This makes it possible to reliably achieve a configuration in which a gap is formed between the measurement protrusion 153 and the remaining predetermined point when the flatness measurement unit 151 is placed on the shelf 201.

In the flatness measurement unit 151, the distance between the apex of the measurement protrusion 153 and the plane defined by the apexes of the respective protrusions 31 of the three contact sections 3 is equal to or greater than the maximum deviation amount. This makes it possible to more reliably achieve a configuration in which a gap is formed between the measurement protrusion 153 and the remaining predetermined point when the flatness measurement unit 151 is placed on the shelf 201.

In the flatness measurement unit 151, the balance weight BW2 is provided. In this case, it is possible to reliably realize a configuration in which the center of gravity G in the flatness measurement unit 151 is positioned inside the area of the triangle TR having vertices at the respective three contact sections 3.

Sixth Embodiment

The following describes a sixth embodiment. In description of the present embodiment, points different from the third embodiment above will be described.

Figure 18:
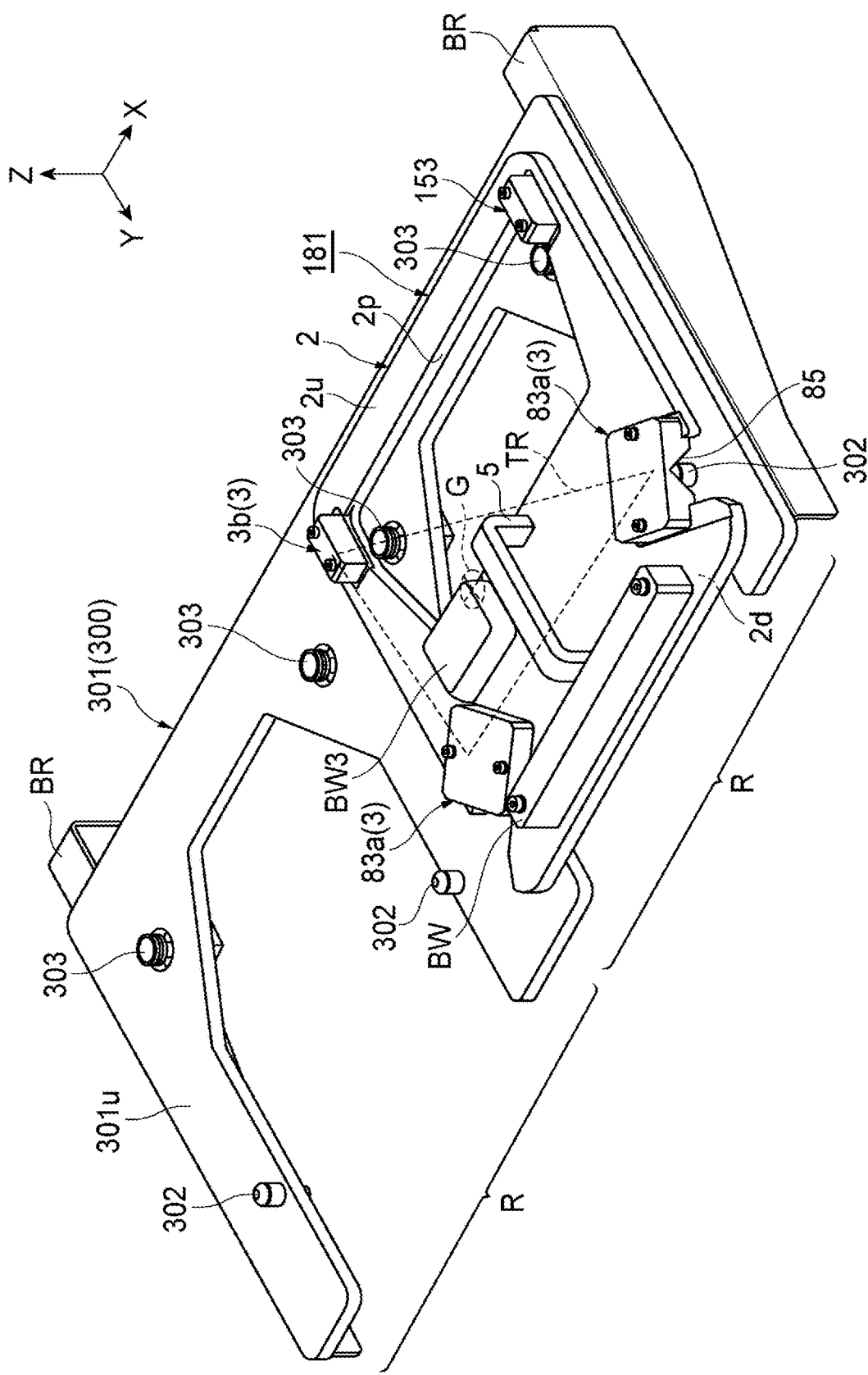
FIG. 18 is a perspective view illustrating a state in which a flatness measurement unit according to a sixth embodiment is placed on a shelf.
Figure 19:
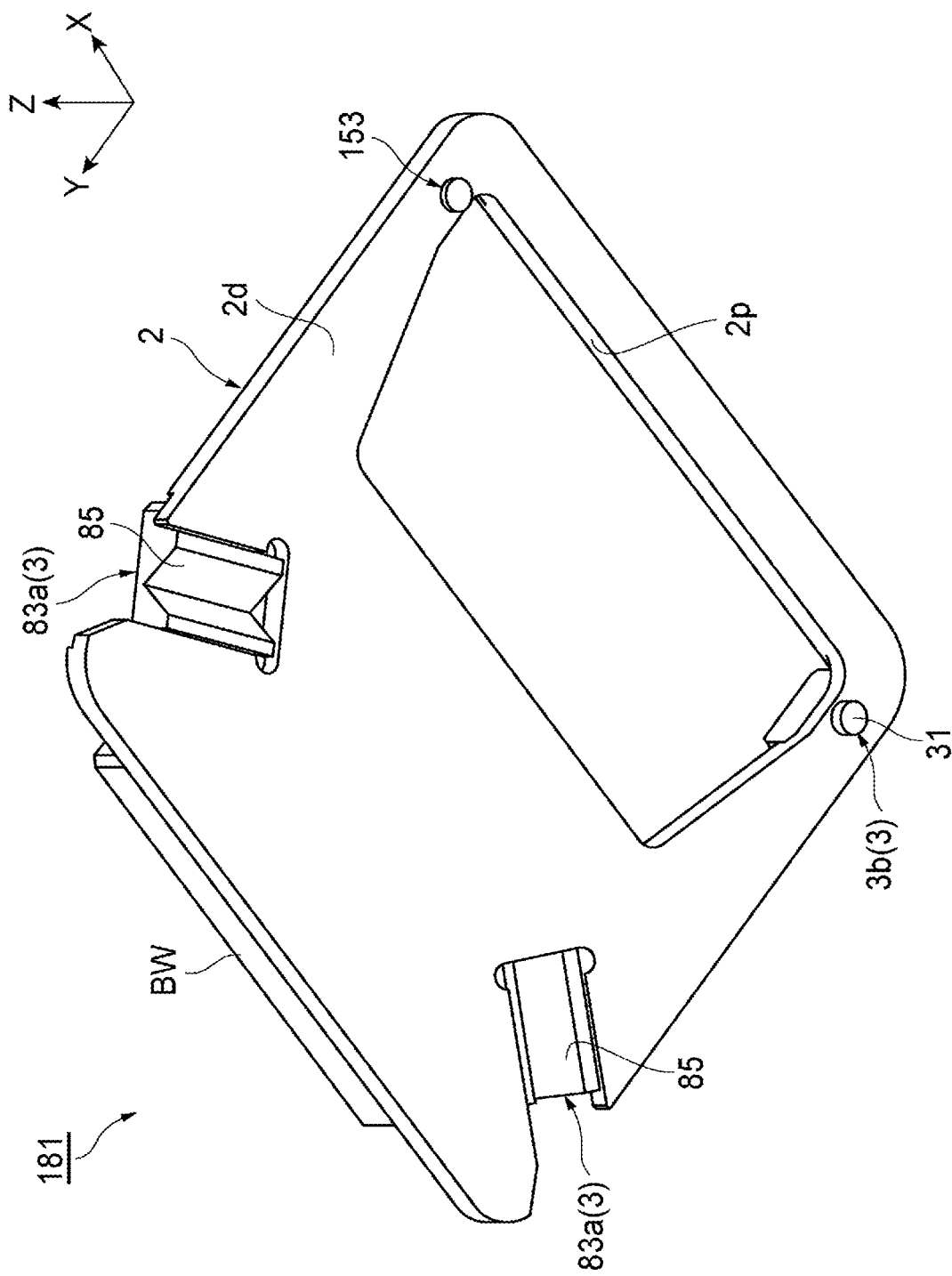
FIG. 19 is a perspective view of the flatness measurement unit according to the sixth embodiment when viewed from below.

FIG. 18 is a perspective view illustrating a flatness measurement unit 181 placed on the shelf 301. FIG. 19 is a perspective view of the flatness measurement unit 181 when viewed from below. As illustrated in FIG. 18 and FIG. 19, the flatness measurement unit 181 according to the present embodiment is placed on the shelf 301 that constitutes a purging shelf of the purging stocker 300.

In the present embodiment, two rear points adjacent to two nozzles 303 on the upper surface 301u of the shelf 301 and two pins 302 of the shelf 301 correspond to the four predetermined points the flatness at which is to be measured by the flatness measurement unit 181. In the flatness measurement unit 181, the three contact sections 3 are dispersedly disposed on the body frame 2. The contact sections 3 are each provided so as to be in contact with two front points adjacent to the respective two pins 302 on the upper surface 301u and with one rear point near one of the nozzles 303 on the upper surface 301u. The three contact sections 3 include two first contact sections 83a and one second contact section 3b. The first contact sections 83a are disposed at two front points in the body frame 2. The second contact section 3b is disposed at one rear point in the body frame 2. The second contact section 3b is disposed at a separated position on the rear side of any one of the two first contact sections 83a.

The flatness measurement unit 181 further includes a balance weight BW3. The balance weight BW3 is a block-shaped weight. The balance weight BW3 is provided in an area inside the area of a triangle TR having vertices at the respective three contact sections 3 on the upper surface 2u of the body frame 2.

The flatness measurement unit 181 includes the measurement protrusion 153 disposed on the body frame 2. The measurement protrusion 153 is provided at a position corresponding to the remaining predetermined point out of the four predetermined points on the shelf 301 other than the three predetermined points in contact with the three contact sections 3 (herein, one rear point adjacent to the other nozzle 303, also referred to simply as "remaining predetermined point"). The measurement protrusion 153 is disposed at a separated position on the rear side of any other of the two first contact sections 83a. The measurement protrusion 153 is provided in a manner protruding from the lower surface 2d of the body frame 2.

The measurement protrusion 153 is configured such that a gap is formed between the measurement protrusion 153 and the remaining predetermined point when the flatness measurement unit 181 is placed on the shelf 301. The height (protruding length) of the measurement protrusion 153 is lower than the plane defined by the apexes of the respective protrusions 31 of the three contact sections 3. The distance between the apex of the measurement protrusion 133 and the plane defined by the apexes of the respective protrusions 31 of the three contact sections 3 may be equal to or greater than a maximum deviation amount. The maximum deviation amount is the amount of a gap between the measurement protrusion 153 and the remaining predetermined point when the flatness is the largest (most deviated from the plane) among assumed cases. The maximum deviation amount is a predetermined value that can be determined in advance by calculation, testing, and/or experience, for example.

The center of gravity G of the flatness measurement unit 181 is positioned inside the area of the triangle TR having vertices at the respective three contact sections 3 in the flatness measurement unit 181. In other words, the weight of the flatness measurement unit 181 on the side on which the measurement protrusion 153 is provided is lighter than the weight on its diagonal side. As can be seen in the figure, the center of gravity G is positioned within the area of the triangle TR that is an area enclosed by the three contact sections 3 in plan view.

The flatness measurement unit 181 thus configured is placed on the shelf 301 such that the V-grooves 85 of the first contact sections 83a are in contact with the two pins 302 and the protrusion 31 of the second contact section 3b is in contact with the one rear point adjacent to the corresponding nozzle 303 on the upper surface 301u. The nozzles 303 of the shelf 301 are inserted into the opening 2p of the body frame 2. Herein, in the flatness measurement unit 181, because a gap is formed between the measurement protrusion 153 and the upper surface 301u, the gap is checked with a gap gauge, and the flatness is measured based on this check result. For example, when a gap gauge of the specified amount can be fittingly inserted, the four predetermined points are determined to be flat. When a gap gauge thicker than the specified amount can be inserted, or when only a gap gauge thinner than the specified amount can be inserted, the four predetermined points are determined to be nonflat.

As described above, the flatness measurement unit 181 also has the same effect as the above-described embodiment, i.e., the effect of making it possible to easily perform the operation of measuring the flatness on the shelf 301.

The flatness measurement unit 181 includes the measurement protrusion 153. The measurement protrusion 153 is configured such that a gap is formed between the measurement protrusion 153 and the remaining predetermined point when the flatness measurement unit 181 is placed on the shelf 301. This allows the flatness to be measured based on the gap between the measurement protrusion 153 and the remaining predetermined point.

In the flatness measurement unit 181, the height of the measurement protrusion 153 is lower than the plane defined by the apexes of the respective protrusions 31 of the three contact sections 3. This makes it possible to reliably achieve a configuration in which a gap is formed between the measurement protrusion 153 and the remaining predetermined point when the flatness measurement unit 181 is placed on the shelf 301.

In the flatness measurement unit 181, the distance between the apex of the measurement protrusion 153 and the plane defined by the apexes of the respective protrusions 31 of the three contact sections 3 is equal to or greater than the maximum deviation amount. This makes it possible to more reliably achieve a configuration in which a gap is formed between the measurement protrusion 153 and the remaining predetermined point when the flatness measurement unit 181 is placed on the shelf 301.

In the flatness measurement unit 181, the balance weight BW3 is provided. In this case, it is possible to reliably realize a configuration in which the center of gravity G in the flatness measurement unit 181 is positioned inside the area of the triangle TR having vertices at the respective three contact sections 3.

Modifications

Although the embodiments have been described above, an aspect of the present invention is not limited to the above embodiments.

In the above embodiments, the four predetermined points where the flatness measurement units 1, 51, 81 are to be placed are not limited to particular ones. The four predetermined points may include various points if they are points on the shelves 101, 201, 301. In the above embodiments, the handles 5 may be omitted.

In the first embodiment above, instead of each V-groove 7v that forms a gap between the measurement protrusion 153 and the corresponding pin 102 on the shelf 101, another groove may be formed or a recess may be formed. In the first embodiment above, each measuring device 4 measures the distance to the corresponding predetermined point on the shelf 101. However, the measuring device 4 may measure the distance to a point near the predetermined point. In the third embodiment above, in each first contact section 83a, instead of the V-groove 85 having an inner surface as a contact surface, another groove may be formed or a recess may be formed. In the fourth embodiment above, the measuring device 4 measures the distance to the predetermined point on the shelf 101. However, the measuring device 4 may measure the distance to a point near the predetermined point.

In the above embodiments, the contact surface of each second contact section 3b has a spherical shape. However, the contact surface may have a convexly curved shape. This shape makes it possible to easily measure the minimum gap between the second contact section 3b and the predetermined point on the shelf, even from a plurality of directions. The thickness of the gap gauge 56 that can be inserted can be prevented from varying depending on the direction in which the gap gauge 56 is inserted. In the above embodiments, the balance weights BW, BW2, BW3 may be omitted.

The materials and shapes of the respective configurations in the embodiments and the modifications above are not limited to those described above, and various types of materials and shapes may be used. Each configuration in the embodiments or modifications above may be optionally applied to each configuration in other embodiments or modifications. Some of the respective configurations in the embodiments or the modifications above may be omitted as appropriate within the scope not departing from the gist of an aspect of the present invention.

REFERENCE SIGNS LIST 1, 51, 81, 121, 151, 181 . . . flatness measurement unit, 2 . . . body frame, 2p . . . opening, 3 . . . contact section, 3a, 83a . . . first contact section, 3b . . . second contact section, 4 . . . measuring device, 5 . . . handle, 7v . . . V-groove, 31 . . . protrusion, 85 . . . V-groove (groove), 101, 201, 301 . . . shelf, 102, 302 . . . pin, 103, 203, 303 . . . nozzle, 153 . . . measurement protrusion, A, A0 . . . area, BW, BW2, BW3 . . . balance weight, G . . . center of gravity, T . . . diagonal line

The invention claimed is:

1. A flatness measurement unit to be placed on a shelf for measuring flatness relating to degree of deviation from a state in which four predetermined points on the shelf are present on the same plane, the flatness measurement unit comprising:
a body frame; and
four contact sections dispersedly disposed on the body frame and provided so as to be in contact with the four predetermined points on the shelf, wherein
the four contact sections include two first contact sections not located diagonally and two second contact sections other than the first contact sections, and
the center of gravity of the flatness measurement unit is positioned in an area containing the two first contact sections, among four areas defined by two diagonal lines each passing through one of the two first contact sections and one of the two second contact sections that are located diagonally.

2. A flatness measurement unit according to claim 1, comprising a measuring device provided near the second contact sections on the body frame and configured to measure a distance to the predetermined point corresponding to each second contact section on the shelf when the flatness measurement unit is placed on the shelf or a distance to a point near the predetermined point.

3. The flatness measurement unit according to claim 1, wherein each second contact section has a protrusion forming a spherical or convexly curved contact surface.

4. The flatness measurement unit according to claim 1, wherein each first contact section has a groove or recess having an inner surface as a contact surface.

5. The flatness measurement unit according to claim 1, wherein each contact section has a hardness lower than that of the body frame.

6. The flatness measurement unit according to claim 1, wherein the body frame is provided with a handle for an operator to grasp.

7. The flatness measurement unit according to claim 1, wherein a balance weight is provided on a side of the body frame closer to the first contact sections.

8. The flatness measurement unit according to claim 1, wherein
a pin protruding upward is provided on the shelf, and
in the body frame, a groove or recess is formed that forms a gap between the pin and the flatness measurement unit when the flatness measurement unit is placed on the shelf.

9. The flatness measurement unit according to claim 1, wherein
a nozzle protruding upward is provided on the shelf, and
the body frame has an opening through which the nozzle passes when the flatness measurement unit is placed on the shelf.

10. A flatness measurement unit to be placed on a shelf for measuring flatness relating to degree of deviation from a state in which four predetermined points on the shelf are present on the same plane, the flatness measurement unit comprising:
a body frame; and
three contact sections dispersedly disposed on the body frame and provided so as to be in contact with three predetermined points out of the four predetermined points on the shelf, wherein
the center of gravity is positioned inside a triangular area having vertices at the three contact sections in the flatness measurement unit.

11. The flatness measurement unit according to claim 10, comprising a measurement protrusion disposed on the body frame and provided at a position corresponding to a remaining predetermined point out of the four predetermined points on the shelf other than the three predetermined points in contact with the three contact sections, wherein
the measurement protrusion is configured such that a gap is formed between the measurement protrusion and the remaining predetermined point when the flatness measurement unit is placed on the shelf.

12. The flatness measurement unit according to claim 11, wherein
each contact section has a protrusion forming a contact surface, and
a height of the measurement protrusion is lower than that of a plane defined by apexes of the protrusions of the three contact sections.

13. The flatness measurement unit according to claim 12, wherein a distance between an apex of the measurement protrusion and the plane defined by the apexes of the respective protrusions of the three contact sections is equal to or greater than a maximum deviation amount.

14. The flatness measurement unit according to claim 10, comprising a measuring device provided to the body frame and configured to, when the flatness measurement unit is placed on the shelf, measure a distance to the remaining predetermined point out of the four predetermined points on the shelf other than the three predetermined points in contact with the three contact sections, or a distance to a point near the remaining predetermined point.

* * * * *